(12) United States Patent
Chung et al.

(10) Patent No.: US 10,580,833 B2
(45) Date of Patent: Mar. 3, 2020

(54) ORGANIC LIGHT EMITTING DISPLAY DEVICE

(71) Applicant: LG DISPLAY CO., LTD., Seoul (KR)

(72) Inventors: EuiHyun Chung, Goyang-si (KR); Yongmin Jeong, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/166,818

(22) Filed: Oct. 22, 2018

(65) Prior Publication Data
US 2019/0058016 A1  Feb. 21, 2019

Related U.S. Application Data

(62) Division of application No. 15/374,178, filed on Dec. 9, 2016, now Pat. No. 10,141,380.

(30) Foreign Application Priority Data

Apr. 29, 2016  (KR) .................. 10-2016-0053491

(51) Int. Cl.
*H01L 29/08* (2006.01)
*H01L 27/32* (2006.01)

(52) U.S. Cl.
CPC ...... *H01L 27/3216* (2013.01); *H01L 27/3218* (2013.01); *H01L 27/3276* (2013.01); *H01L 27/3246* (2013.01)

(58) Field of Classification Search
CPC . H01L 27/32; H01L 27/3216; H01L 27/3218; H01L 27/3246; H01L 27/3276
See application file for complete search history.

(56) References Cited

U.S. PATENT DOCUMENTS

| 7,417,648 | B2 | 8/2008 | Credelle |
| 7,443,093 | B2 | 10/2008 | Jianpu et al. |
| 8,159,117 | B2 | 4/2012 | Karaki et al. |
| 8,253,323 | B2 | 8/2012 | Sung et al. |
| 8,330,352 | B2 | 12/2012 | Sung et al. |
| 8,338,832 | B2 | 12/2012 | Kim |

(Continued)

FOREIGN PATENT DOCUMENTS

| CN | 102063865 A | 5/2011 |
| CN | 104269411 A | 1/2015 |

(Continued)

*Primary Examiner* — Phuc T Dang
(74) *Attorney, Agent, or Firm* — Birch, Stewart, Kolasch & Birch, LLP

(57) ABSTRACT

An organic light emitting display device, includes a plurality of pixels, each of the plurality of pixels including at least one red sub pixel, at least one green sub pixel, and at least one blue sub pixel, wherein red sub pixels and blue sub pixels of adjacent pixels are aligned in a first direction and are also aligned in a second direction, the second direction being a direction that intersects the first direction, wherein green pixels of adjacent pixels are aligned in the first direction and are also aligned in the second direction, wherein the at least one green sub pixel of each pixel is disposed between the at least one red sub pixel and the at least one blue sub pixel of the each pixel, and wherein the at least one green sub pixel is offset from the at least one red sub pixel and the at least one blue sub pixel in the first direction and the second direction in the each pixel.

20 Claims, 19 Drawing Sheets

(56) References Cited

U.S. PATENT DOCUMENTS

| | | |
|---|---|---|
| 8,552,635 B2 | 10/2013 | Kim et al. |
| 8,716,929 B2 | 5/2014 | Yoo et al. |
| 8,754,913 B2 | 6/2014 | Hwang et al. |
| 8,994,015 B2 | 3/2015 | Pyon et al. |
| 9,041,625 B2 | 5/2015 | Hwang et al. |
| 9,307,584 B2 | 4/2016 | Ko |
| 9,318,537 B2 | 4/2016 | Sung et al. |
| 9,324,262 B2 | 4/2016 | Kim et al. |
| 2005/0110398 A1 | 5/2005 | Lee |
| 2005/0200788 A1 | 9/2005 | Edwards |
| 2007/0002084 A1 | 1/2007 | Kimura et al. |
| 2010/0039011 A1 | 2/2010 | Karaki et al. |
| 2011/0025723 A1 | 2/2011 | Kim |
| 2013/0234917 A1 | 9/2013 | Lee |
| 2014/0001447 A1 | 1/2014 | Kim et al. |
| 2014/0071030 A1 | 3/2014 | Lee |
| 2015/0015466 A1 | 1/2015 | Feng |
| 2015/0236077 A1 | 8/2015 | Huang et al. |
| 2015/0279911 A1 | 10/2015 | Park et al. |
| 2015/0364526 A1 | 12/2015 | Peng et al. |
| 2016/0035288 A1 | 2/2016 | Chu Ke |
| 2016/0057817 A9 | 2/2016 | Ko |
| 2016/0063911 A1* | 3/2016 | Wu .................. G09G 3/3208 345/211 |
| 2016/0078807 A1 | 3/2016 | Sun et al. |
| 2016/0197123 A1 | 7/2016 | Sung et al. |
| 2016/0197125 A1 | 7/2016 | Ko |
| 2016/0315126 A1* | 10/2016 | Huang ................ H01L 27/326 |
| 2016/0358985 A1* | 12/2016 | Bai .................... H01L 27/3218 |
| 2017/0125490 A1 | 5/2017 | Li et al. |
| 2017/0169748 A1* | 6/2017 | Chen .................... G09G 3/2003 |

FOREIGN PATENT DOCUMENTS

| | | |
|---|---|---|
| JP | 2008-209902 A | 9/2008 |
| JP | 2012-28170 A | 2/2012 |
| KR | 10-0560789 B1 | 3/2006 |
| KR | 10-0729077 B1 | 6/2007 |
| KR | 10-2008-0035774 A | 4/2008 |
| KR | 10-2009-0049515 A | 5/2009 |
| KR | 10-2010-0001598 A | 1/2010 |
| KR | 10-2011-0013691 A | 2/2011 |
| KR | 10-1066411 B1 | 9/2011 |
| KR | 10-2011-0117612 A | 10/2011 |
| KR | 10-2011-0117613 A | 10/2011 |
| KR | 10-2011-0129531 A | 12/2011 |
| KR | 10-2012-0020087 A | 3/2012 |
| KR | 10-2013-0007309 A | 1/2013 |
| KR | 10-2013-0025741 A | 3/2013 |
| KR | 10-2013-0101874 A | 9/2013 |
| KR | 10-2014-0020120 A | 2/2014 |
| KR | 10-2014-0111505 A | 9/2014 |
| KR | 10-2015-0007261 A | 1/2015 |
| KR | 10-2015-0007992 A | 1/2015 |
| KR | 10-2015-0107883 A | 9/2015 |
| KR | 10-2015-0122564 A | 11/2015 |
| KR | 10-2016-0018936 A | 2/2016 |
| KR | 10-2016-0019243 A | 2/2016 |
| KR | 10-2016-0029376 A | 3/2016 |

* cited by examiner

ORGANIC LIGHT EMITTING DISPLAY DEVICE

CROSS-REFERENCE TO RELATED APPLICATION

This application is a Divisional of U.S. patent application Ser. No. 15/374,178 filed on Dec. 9, 2016,(now U.S. Pat. No. 10,141,380 issued Nov. 27, 2018), which claims the priority benefit of Korean Patent Application No. 10-2016-0053491 filed on Apr. 29, 2016, in the Korean Intellectual Property Office, all of which are hereby expressly incorporated by reference into the present application.

BACKGROUND OF THE INVENTION

Field of the Invention

The present disclosure relates to an organic light emitting display device, and more particularly, to an organic light emitting display device having an improved life span.

Description of the Related Art

Recently, as society advances to the information society, the field of display devices which visually express electrical information signals is rapidly advancing. Thus, various display devices with performance, such as thinness, lightness, and low power consumption have been developed.

Specific examples of the display devices include a Liquid Crystal Display (LCD) device, a Plasma Display Panel (PDP) device, a Field Emission Display (FED) device, an Organic Light Emitting Display (OLED) device, and the like.

Particularly, the OLED device is a self-emitting device and has advantages such as a high response time, a high luminous efficiency, a high brightness, and a wide viewing angle as compared with the other display devices. Therefore, the OLED device is attracting much attention.

Further, an organic light emitting diode applied to the OLED device is regarded as a next-generation light source which is self-luminous. The OLED has excellent advantages in terms of viewing angle, contrast, response time, and power consumption as compared with the LCD device. Furthermore, the OLED has a surface-emitting structure and thus can be easily implemented to be flexible.

The OLED device includes a plurality of pixels. Each of the plurality of pixels includes at least a red sub pixel, a green sub pixel, and a blue sub pixel. The red sub pixel, the green sub pixel, and the blue sub pixel emit red, green, and blue lights, respectively. A full-color image may be provided through a plurality of sub pixels. Herein, each of the plurality of pixels includes an emission area where a red, green, or blue light is emitted and a non-emission area.

In order to dispose organic emission layers on the red sub pixel, the green sub pixel, and the blue sub pixel, respectively, a predetermined process margin is needed between the organic emission layers. Since an organic emission layer is not disposed or a bank layer is disposed to define pixels due to a process margin, a non-emission area is present between emission areas.

Recently, the OLED device has been developed to have a smaller size and a higher resolution. Thus, the size of a pixel is decreased. Even if a pixel size is decreased, a fine metal mask (FMM) used in disposing an organic emission layer needs a process margin. Thus, a non-emission area corresponding to the process margin for the FMM cannot be greatly reduced. Accordingly, as the resolution of an OLED device is increased, the size of a sub pixel is decreased or maintained due to a process margin for an FMM. Thus, it is difficult to develop a high-resolution OLED device.

An example of a pixel array structure and an organic light emitting display including the same is discussed in Korean Patent Publication No. 2014-0020120 (U.S. Pat. No. 9,324,262).

SUMMARY OF THE INVENTION

The inventors of the present disclosure recognized a method of arranging sub pixels between pixels to minimize a distance between the sub pixels in a high-resolution structure of an organic light emitting display device. Then, the inventors of the present disclosure invented an organic light emitting display device having a high-resolution structure in which the size of a sub pixel can be increased.

Accordingly, an object to be achieved by the present disclosure is to provide an organic light emitting display device which arrange at least one sub pixel to be separated into two parts and arranging sub pixels emitting the same color to be adjacent to each other, to increase the size of the pixel in a high-resolution structure.

Another object to be achieved by the present disclosure is to provide an organic light emitting display device which the size of a sub pixel is increased in a high-resolution structure, and, thus, power consumption can be reduced and a life span can be improved.

The objects of the present disclosure are not limited to the aforementioned objects, and other objects, which are not mentioned above, will be apparent to a person having ordinary skill in the art from the following description.

According to another aspect of the present disclosure, an organic light emitting display device includes a plurality of pixels, each of the plurality of pixels including at least one red sub pixel, at least one green sub pixel, and at least one blue sub pixel. Red sub pixels and blue sub pixels of adjacent pixels are aligned in a first direction and are also aligned in a second direction, the second direction being a direction that intersects the first direction. Green pixels of adjacent pixels are aligned in the first direction and are also aligned in the second direction. The at least one green sub pixel of each pixel is disposed between the at least one red sub pixel and the at least one blue sub pixel of the each pixel, and the at least one green sub pixel is offset from the at least one red sub pixel and the at least one blue sub pixel in the first direction and the second direction in the each pixel.

According to the present disclosure, an organic light emitting display device includes a plurality of pixels, each of the plurality of pixels including a plurality of sub pixels having one of a plurality of colors, and a first distance between the plurality of sub pixels of different colors is greater than a second distance between the plurality of sub pixels of the same color.

According to an aspect of the present disclosure, an organic light emitting display device includes a plurality of pixels. Each of the plurality of pixels includes a plurality of first sub pixels, at least one second sub pixel, and at least one third sub pixel. The plurality of first sub pixels are disposed on a first line extended in a first direction, the at least one second sub pixel is disposed on one side of the first line, and the at least one third sub pixel is disposed on the other side of the first line. The at least one second sub pixel and the at least one third sub pixel are disposed on a second line extended in a second direction different from the first direction. A reference pixel among the plurality of pixels and an adjacent pixel adjacent to the reference pixel in the second direction are symmetric with respect to a boundary line between the reference pixel and the adjacent pixel. In the organic light emitting display device according to an aspect of the present disclosure, sub pixels emitting the same color are arranged adjacent to each other. Thus, it is possible to secure a margin sufficient to arrange sub pixels emitting different colors and also possible to increase the size of each sub pixel.

According to another aspect of the present disclosure, an organic light emitting display device includes a plurality of pixels. Each of the plurality of pixels includes a plurality of first sub pixels commonly connected to a first data line, and a second sub pixel and a third sub pixel commonly connected to a second data line parallel to the first data line. A reference pixel among the plurality of pixels is symmetric to an adjacent pixel with respect to a boundary line between the reference pixel and the adjacent pixel adjacent to the reference pixel in an extension direction of the second data line. In the organic light emitting display device according to another aspect of the present disclosure, adjacent sub pixels emitting the same color are connected to the same data line. Thus, it is possible to supply the same current to the adjacent sub pixels emitting the same color and also possible to provide the same brightness.

Details of other example embodiments will be included in the detailed description of the disclosure and the accompanying drawings.

According to the present disclosure, sub pixels emitting the same color are arranged adjacent to each other. Thus, it is possible to secure a margin sufficient to arrange sub pixels emitting different colors and also possible to increase the size of each sub pixel.

According to the present disclosure, sub pixels emitting the same color are arranged adjacent to each other, so that the size of each sub pixel is increased. Thus, it is possible to secure the brightness of the sub pixels by supplying a low current, reduce power consumption of pixels, and improve a life span of an organic light emitting diode.

According to the present disclosure, a distance between sub pixels emitting the same color can be reduced to about half as compared with the related art, and, thus, an emission area of sub pixels can be increased. Therefore, the limitation in distance between pixels can be solved, and, thus, it is possible to provide organic light emitting display device having a high-resolution.

The effects of the present disclosure are not limited to the aforementioned effects, and various other effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENTS

Figure 1:
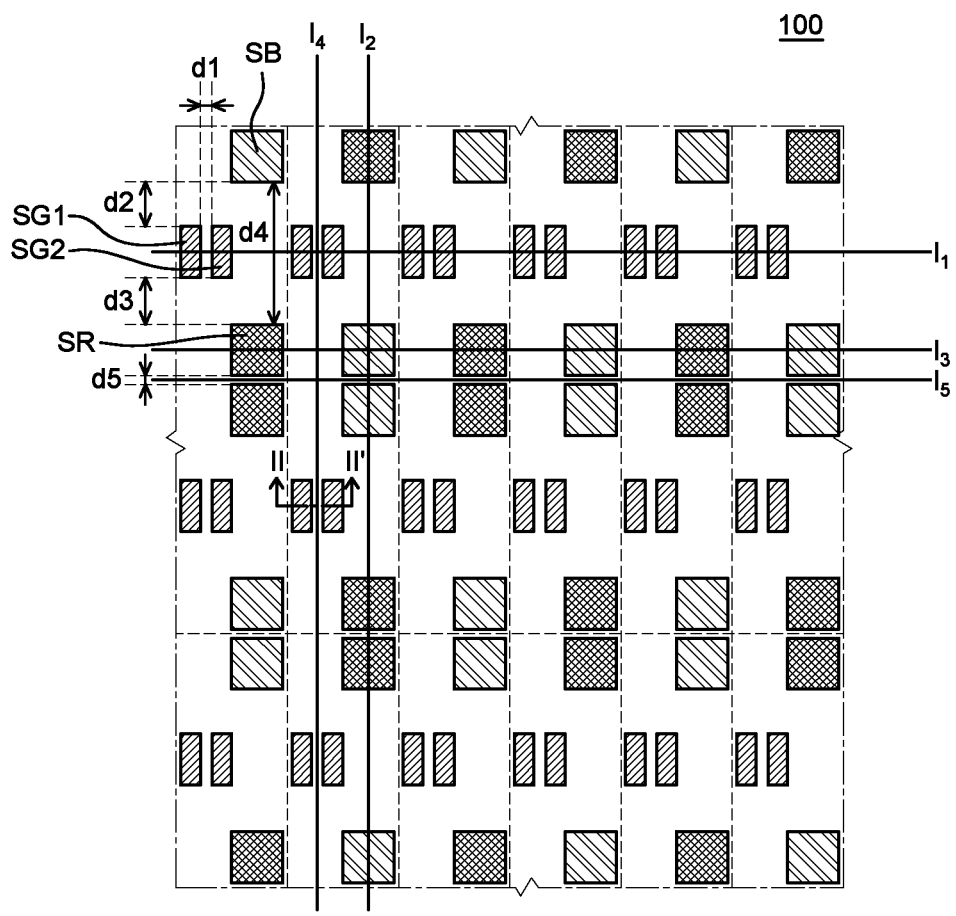
FIG. 1 is a schematic plan view provided to explain an organic light emitting display device according to an example embodiment of the present disclosure.

Advantages and features of the present disclosure, and methods for accomplishing the same will be more clearly understood from example embodiments described below with reference to the accompanying drawings. However, the present disclosure is not limited to the following example embodiments but may be implemented in various different forms. The example embodiments are provided only to complete disclosure of the present disclosure and to fully provide a person having ordinary skill in the art to which the present disclosure pertains with the category of the disclosure, and the present disclosure will be defined by the appended claims.

The shapes, sizes, ratios, angles, numbers, and the like illustrated in the accompanying drawings for describing the example embodiments of the present disclosure are merely examples, and the present disclosure is not limited thereto. Same reference numerals generally denote same elements throughout the present specification. Further, in the following description, a detailed explanation of known related technologies may be omitted to avoid unnecessarily obscuring the subject matter of the present disclosure. The terms such as "including," "having," and "comprising" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly" is not used.

When an element or layer is referred to as being "on" another element or layer, it may be directly on the other element or layer, or intervening elements or layers may be present.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Throughout the whole specification, the same reference numerals denote the same elements.

Since the size and thickness of each component illustrated in the drawings are represented for convenience in explanation, the present disclosure is not necessarily limited to the illustrated size and thickness of each component.

The features of various embodiments of the present disclosure can be partially or entirely bonded to or combined with each other and can be interlocked and operated in technically various ways, and the embodiments can be carried out independently of or in association with each other.

In the present disclosure, the term "reference pixel" refers to any one of a plurality of pixels and a group of sub pixels equivalent thereto, and includes a red sub pixel, a green sub pixel, and a blue sub pixel. The term "reference pixel" refers to a pixel exemplified to explain relationships with other pixels, and each of the plurality of pixels may become "a reference pixel".

Hereinafter, various example embodiments of the present disclosure will be described in detail with reference to the accompanying drawings.

FIG. 1 is a schematic plan view provided to explain an organic light emitting display device according to an example embodiment of the present disclosure. FIG. 1 schematically illustrates some of a plurality of pixels in an organic light emitting display device, and redundant descriptions of the repeated configurations in the drawings will be omitted.

Referring to FIG. 1, an organic light emitting display device 100 includes a plurality of pixels, and each of the plurality of pixels includes a plurality of sub pixels. The plurality of sub pixels includes a red sub pixel SR, a green sub pixel SG, and a blue sub pixel SB which emit red, green, and blue lights, respectively. However, the sub pixels of the organic light emitting display device 100 are not limited thereto. The organic light emitting display device 100 may further include a white sub pixel in addition to the red sub pixel SR, the green sub pixel SG, and the blue sub pixel SB.

Referring to FIG. 1, one pixel includes a plurality of green sub pixels SG1 and SG2, one red sub pixel SR, and one blue sub pixel SB. Further, each of the plurality of green sub pixels SG1 and SG2 has a rectangular shape extended in a Y-axis direction. That is, each of the plurality of green sub pixels SG1 and SG2 has a rectangular shape of which long sides are parallel to a second line.

FIG. 1 illustrates that the two green sub pixels SG1 and SG2, the one red sub pixel SR and the one blue sub pixel SB are included in the one pixel. Further, FIG. 1 illustrates that each of the plurality of green sub pixels SG1 and SG2 has a rectangular shape of which long sides are parallel to the second line. However, the number and the shape of sub pixels are not limited to those illustrated in FIG. 1 and may be modified in various ways.

Herein, in the one pixel, the whole area of the plurality of green sub pixels SG1 and SG2 may be smaller than an area of each of the red sub pixel SR and the blue sub pixel SB. Among green wavelengths, red wavelengths, and blue wavelengths which have the same energy intensity, the green wavelengths are recognized as being brighter. Therefore, the plurality of green sub pixels SG1 and SG2 are configured smaller than each of the red sub pixel SR and the blue sub pixel SB. For another reason, the red sub pixel SR or the blue sub pixel SB may be formed smaller than the sub pixels of other colors.

Referring to FIG. 1, in each of the plurality of pixels, the plurality of green sub pixels SG1 and SG2 is disposed on a first line $l_1$ extended in an X-axis direction and a line parallel to the first line.

Further, in each of the plurality of pixels, each of the red sub pixel SR and the blue sub pixel SB are disposed on different sides with respect to the first line $l_1$. In detail, in one of the plurality of pixels, the blue sub pixel SB is disposed on an upper side of the first line $l_1$, the red sub pixel SR is disposed on a lower side of the first line $l_1$. If the red sub pixel SR is disposed on the upper side of the first line $l_1$, the blue sub pixel SB is disposed on the lower side of the first line $l_1$. That is, in a plurality of pixels disposed in the X-axis direction, each of the red sub pixels SR and the blue sub pixels SB are disposed in zigzag shapes with respect to the first line $l_1$.

Referring to FIG. 1, in each of the plurality of pixels, the red sub pixel SR and the blue pixel SB are disposed on a second line $l_2$ parallel to the Y-axis direction and a line parallel to the second line. In detail, in a plurality of pixels disposed in the Y-axis direction, sub pixels on the second line $l_2$ and the line parallel to the second line are disposed in sequence of red-blue-blue-red-red-blue-blue- and so on.

Herein, the second line $l_2$ may be a data line, and the red sub pixel SR and the blue pixel SB disposed on the second line $l_2$ may be commonly connected to the same data line. A structure in which the plurality of green sub pixels SG1 and SG2 is commonly connected to a data line will be described later with reference to FIG. 2.

Referring to FIG. 1, in each of the plurality of pixels, the red sub pixel SR and the blue pixel SB are disposed on a third line $l_3$ parallel to the X-axis direction and a line parallel to the third line. In detail, in a plurality of pixels disposed in the X-axis direction, sub pixels on the third line $l_3$ and the line parallel to the third line are disposed in sequence of red-blue-red-blue- and so on. That is, red sub pixels SR and blue sub pixels SB on the third line $l_3$ parallel to the first line $l_1$ extended in the X-axis direction are alternately disposed.

Referring to FIG. 1, in each of the plurality of sub pixels, each of the plurality of green sub pixels SG1 and SG2 is disposed symmetric to each other with respect to a fourth line $l_4$ parallel to the Y-axis direction. Further, in the plurality of pixels disposed in the Y-axis direction, the plurality of green sub pixels SG1 and SG2 is disposed symmetric to each other with respect to the fourth line $l_4$ and a line parallel to the fourth line.

Herein, the fourth line $l_4$ may be a data line, and each of the plurality of green sub pixels SG1 and SG2 may share a data line and may be commonly connected to the data line. Meanwhile, in one pixel, each of the plurality of green sub pixels SG1 and SG2 may be connected to different gate lines and may emit lights by different driving thin film transistors. The structure in which each of the plurality of green sub pixels SG1 and SG2 is commonly connected to a data line will be described later with reference to FIG. 2.

Referring to FIG. 1, if any one among the plurality of pixels is selected as a reference pixel, an adjacent pixel adjacent to the reference pixel in the Y-axis direction is symmetric to the reference pixel with respect to a boundary line between the reference pixel and the adjacent pixel. Herein, there may be a plurality of boundary lines between the reference pixel and the adjacent pixel. One among the plurality of boundary lines will be set and exemplified as a fifth line $l_5$. For example, if the reference pixel is a pixel in which the blue sub pixel SB is disposed on the upper side of the first line $l_1$ and the red sub pixel SR is disposed on the lower side of the first line $l_1$, the reference pixel and the red sub pixels SR of the adjacent pixel are disposed to be adjacent to the fifth line $l_5$ which is a boundary line between the reference pixel and the adjacent pixel. Further, the reference pixel and the blue sub pixels SB of adjacent pixel are disposed to be spaced from the fifth line $l_5$. That is, a plurality of green sub pixels, a red sub pixel, and a blue sub pixel of the adjacent pixel which is adjacent to the reference pixel in the Y-axis direction are respectively disposed symmetric with respect to the boundary line.

Referring to FIG. 1, the sub pixels in the pixels disposed in the X-axis direction are disposed symmetric to the sub pixels in the pixels adjacent thereto in the Y-axis direction with respect to the boundary line. Thus, a group of the pixels disposed in the X-axis direction is defined as a pixel block in the present specification. A first pixel block PB1 refers to a group of pixels disposed in a first row, a second pixel block PB2 refers to a group of pixels disposed in a second row, and a third pixel block PB3 refers to a group of pixels disposed in a third row. FIG. 1 illustrates only three pixel blocks which are only some of the plurality of pixels of the organic light emitting display device 100. In some example embodiments, the number and configuration of pixel blocks may be modified.

The pixel blocks are disposed to be symmetric to each other. In detail, pixel blocks adjacent to each other are vertically mirror-symmetric to each other with respect to a boundary line between the pixel blocks. Two pixel blocks adjacent to each other are repeatedly disposed throughout the organic light emitting display device 100. For example, the first pixel block PB1 and the second pixel block PB2 are mirror-symmetric to each other with respect to the fifth line $l_5$ which is a boundary line therebetween. And, the first pixel block PB1 and the second pixel block PB2 are repeatedly disposed in a vertical direction along the Y-axis. Thus, in the first pixel block PB1 and the third pixel block PB3, the sub pixels are disposed in the same manner. The pixel blocks in which the sub pixels are disposed in the same manner are alternately disposed in the vertical direction along the Y-axis.

Referring to FIG. 1, a distance between sub pixels emitting different colors is greater than a distance between sub pixels emitting the same color. In detail, in one of the plurality of pixels, a distance $d_2$ between the blue sub pixel SB and the plurality of green sub pixels SG1 and SG2, a distance $d_3$ between the red sub pixel SR and the plurality of green sub pixels SG1 and SG2, and a distance $d_4$ between the red sub pixel SR and the blue sub pixel SB are greater than a distance $d_1$ between the plurality of green sub pixels SG1 and SG2. Further, the distance $d_2$ between the blue sub pixel SB and the plurality of green sub pixels SG1 and SG2, the distance $d_3$ between the red sub pixel SR and the plurality of green sub pixels SG1 and SG2, and the distance $d_4$ between the red sub pixel SR and the blue sub pixel SB among the plurality of sub pixels are greater than a distance $d_5$ between red sub pixels SR or blue sub pixels SB disposed adjacent to each other in adjacent pixels. In order to secure a maximum distance between sub pixels emitting different colors, the distance $d_2$ between the green sub pixel SB and the plurality of green sub pixels SG1 and SG2 may be equal to the distance $d_3$ between the red sub pixel SR and the plurality of green sub pixels SG1 and SG2.

Accordingly, in the organic light emitting display device 100 of the present disclosure, a distance between sub pixels emitting the same color may be adjusted as short as possible and a distance between sub pixels emitting different colors may be adjusted as long as possible during a process. In detail, the sub pixels emitting the same color are disposed using the same FMM and the sub pixels emitting different colors are disposed using different FMMs. Thus, a predetermined distance is needed between the sub pixels emitting different colors due to a margin required to use the FMMs. That is, the sub pixels emitting the same color in the adjacent pixels may be disposed through an opening of the same FMM and thus do not need a separate FMM margin, whereas only the sub pixels emitting different colors need an FMM margin therebetween. Further, since it is not necessary to secure an FMM margin in the distance between the sub pixels emitting the same color, a minimum width of a bank layer may be applied.

In the organic light emitting display device 100 of the present disclosure, a distance between the sub pixels emitting the same color is minimized and a distance between the sub pixels emitting different colors is secured. Thus, the size of each sub pixel can be increased. That is, in the organic light emitting display device 100, the size of each sub pixel can be increased as much as a distance between the sub pixels emitting the same color can be reduced. Thus, it is possible to arrange sub pixels with a high resolution. And, a distance between the sub pixels emitting the same color can be greatly reduced as compared with the related art. Thus, an emission area of sub pixels can be increased. For example, the emission area may be increased by about 10% or more as compared with the related art. Therefore, according to the organic light emitting display device 100 of the present disclosure, the limitation in distance between pixels can be solved. Thus, it is possible to provide the organic light emitting display device having a high-resolution. Particularly, the organic light emitting display device 100 according to an example embodiment of the present disclosure can be applied to mobile or virtual reality (VR) products demanded to have a high resolution. For example, the organic light emitting display device 100 may be implemented to have a resolution of 800 ppi or more.

Figure 2:
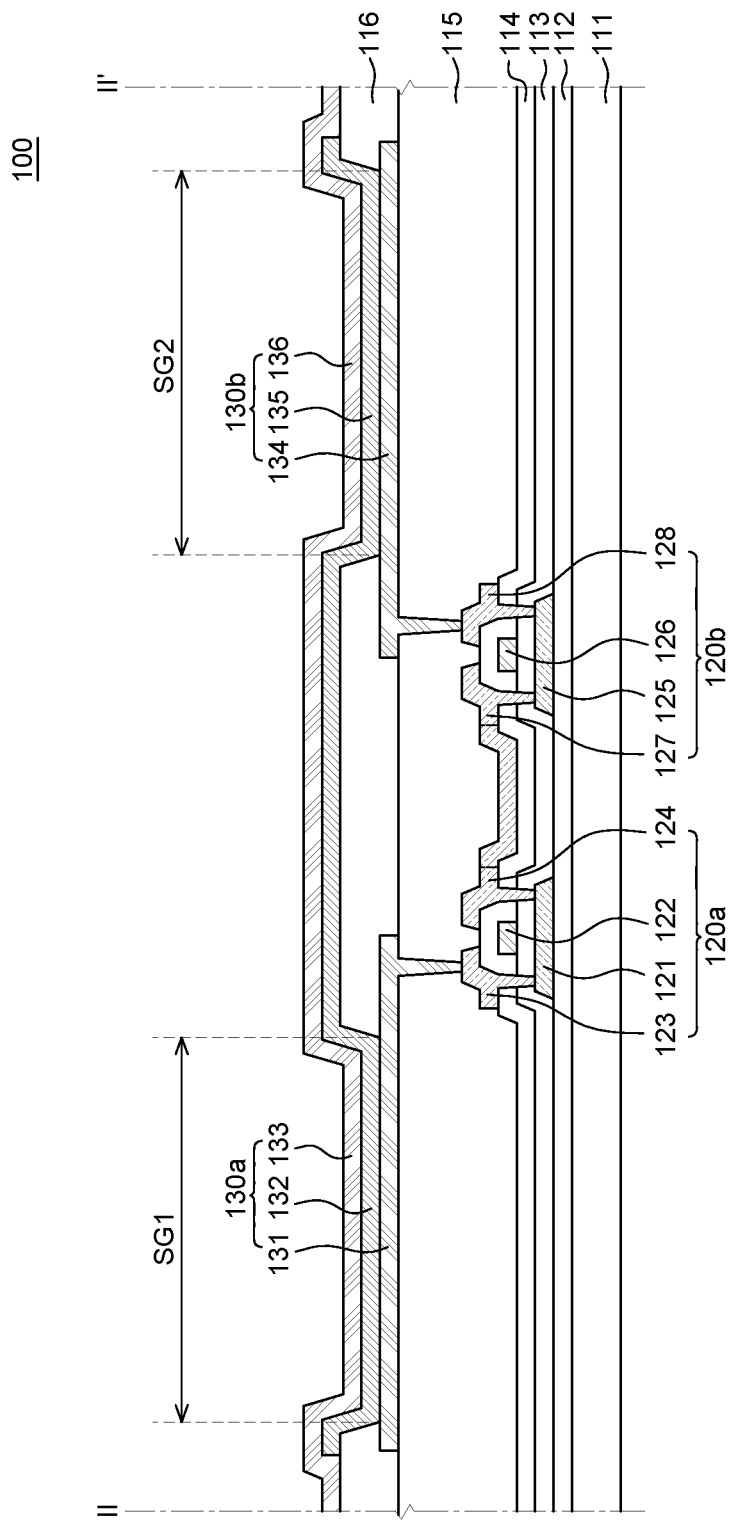
FIG. 2 is a schematic cross-sectional view taken along a line II-II' of FIG. 1 provided to explain the organic light emitting display device according to an example embodiment of the present disclosure.

FIG. 2 is a schematic cross-sectional view taken along a line II-IF of FIG. 1 provided to explain the organic light emitting display device according to an example embodiment of the present disclosure. FIG. 2 schematically illustrates only green sub pixels and a driving thin film transistor of the organic light emitting display device. FIG. 2 illustrates a plurality of green sub pixels SG1 and SG2 in one pixel. A first green sub pixel SG1 is connected to a first thin film transistor 120a and a second green sub pixel SG2 is connected to a second thin film transistor 120b.

For convenience in explanation, configurations of a first organic light emitting diode 130a and the first thin film transistor 120a will be described focusing on the first green sub pixel SG1 with reference to FIG. 1 and FIG. 2. Redundant descriptions of the repeated configurations of a second organic light emitting diode 130b and the second thin film transistor 120b corresponding to the second green sub pixel SG2 will be omitted or will be briefly discussed below.

A substrate 111 is configured to support and protect various components of the organic light emitting display device 100. The substrate 111 may be formed of an insulating material, and may be formed of a material having flexibility such as glass or a polyimide-based material. If the organic light emitting display device 100 is a flexible organic light emitting display device 100, the substrate 111 may be formed of a flexible material such as plastic. Further, if an organic light emitting diode that facilitates flexibility is applied to a lighting device or display device for vehicle or automotive display device, the degree of freedom in design and various design of a lighting device or display device for vehicle or automotive display device can be secured according to a structure or external shape of a vehicle.

In some example embodiments, the organic light emitting display device 100 may be applied to various display devices including a TV, a mobile PC, a tablet PC, a monitor, a laptop computer, and a display device for vehicle or an automotive display device. Further, in some example embodiments, the organic light emitting display device 100 may be applied to a wearable display device, a foldable display device, and a rollable or a bendable display device.

A buffer layer 112 is disposed on the substrate 111. The buffer layer 112 is configured to suppress infiltration of moisture or impurities through the substrate 111 and flatten or planarize an upper part of the substrate 111. However, the buffer layer 112 is not required. Thus, whether or not to form the buffer layer 112 is determined on the basis of the kind of the substrate 111 or the kind of the first thin film transistor 120a applied to the organic light emitting display device 100.

The first thin film transistor 120a is disposed on the buffer layer 112 and supplies a signal to the first green organic light emitting diode 130a. The first thin film transistor 120a includes an active layer 121, a gate electrode 122, a drain electrode 123, and a source electrode 124. In detail, the active layer 121 is formed on the buffer layer 112 and a gate insulation layer 113 configured to insulate the active layer 121 and the gate electrode 122 is formed on the active layer 121. Further, the gate electrode 122 is formed on the gate insulation layer 113 so as to be overlapped with the active layer 121. Also, an interlayer insulation layer 114 is formed on the gate electrode 122 and the gate insulation layer 113. The drain electrode 123 and the source electrode 124 are formed on the interlayer insulation layer 114. The drain electrode 123 and the source electrode 124 are electrically connected to the active layer 121.

And, the active layer 121 may be formed of an amorphous silicon (a-Si), a polycrystalline silicon (poly-Si), an oxide semiconductor, or an organic semiconductor. If the active layer 121 is formed of the oxide semiconductor, the active layer 121 may be formed of indium tin oxide (ITO), indium zinc oxide (IZO), indium gallium zinc oxide (IGZO), or indium tin zinc oxide (ITZO), but is not limited thereto.

For convenience in explanation, FIG. 2 illustrates only a driving thin film transistor connected to an anode 131 of the first green sub pixel from among various thin film transistors which can be included in the first green sub pixel SG1. However, the first green sub pixel SG1 may further include a switching thin film transistor or a capacitor for driving the first green organic light emitting diode 130a. Further, in the present specification, the first thin film transistor 120a is described as having a coplanar structure. However, the first thin film transistor 120a having an inverted staggered structure may be used. Furthermore, in the drawings, the anode of the organic light emitting diode is illustrated as being connected to the drain electrode 123 of the first thin film transistor 120a. However, the anode 131 of the green organic light emitting diode 130a may be connected to the source electrode 124 of the first thin film transistor 120a depending on a design.

A planarizing layer 115 is disposed on the first thin film transistor 120a. The planarizing layer 115 is configured to planarize the upper part of the substrate 111, and may be formed of an organic insulating material so as to cover a step on the upper part of the substrate 111. The planarizing layer 115 includes a contact hole for electrically connecting the anode 131 of the first green sub pixel SG1 to the drain electrode 123 of the first thin film transistor 120a and a contact hole for electrically connecting an anode 134 of the second green sub pixel SG2 to a drain electrode 128 of the second thin film transistor 120b.

Referring to FIG. 2, the source electrode 124 of the first thin film transistor 120a and a source electrode 127 of the second thin film transistor 120b may be connected to each other. In detail, the source electrode 124 of the first thin film transistor 120a and the source electrode 127 of the second thin film transistor 120b are connected to the same data line and thus can be connected to each other. However, the gate electrode 122 of the first thin film transistor 120a and a gate electrode 126 of the second thin film transistor 120b are not connected to each other. That is, the first thin film transistor 120a and the second thin film transistor 120b are connected to the same data line but not connected to the same gate line. Thus, the first green sub pixel SG1 and the second green sub pixel SG2 can emit lights by different thin film transistors, respectively, and can emit lights at the same brightness by substantially the same current supplied through the same data line.

The first green organic light emitting diode 130a is disposed on the planarizing layer 115 and includes the anode 131, an organic emission layer 132, and a cathode 133.

The anode 131 is an electrode configured to supply holes to the organic emission layer 132 and may be formed of a transparent conductive material having a high work function. Herein, the transparent conductive material may include indium tin oxide (ITO), indium zinc oxide (IZO), and indium tin zinc oxide (ITZO). If the organic light emitting display device 100 is driven in a top emission method as illustrated in FIG. 2, the anode 131 may further include a reflecting plate. Herein, the anode 131 may also be referred to as a pixel electrode.

The cathode 133 is an electrode configured to supply electrons. The cathode 133 may be formed of a metallic material, e.g., silver (Ag), titanium (Ti), aluminum (Al), molybdenum (Mo), or an alloy (Ag:Mg) of silver (Ag) and magnesium (Mg), having a lower work function. Herein, the cathode 133 may also be referred to as a common electrode.

Each organic light emitting diode includes an organic emission layer. In detail, the organic emission layer is disposed between an anode and a cathode. For example, in the first green organic light emitting diode 130a, the green organic emission layer 132 is disposed between the anode 131 and the cathode 133. And, in the second green organic light emitting diode 130b, a green organic emission layer 135 is disposed between the anode 134 and a cathode 136.

A red organic emission layer, a green organic emission layer, and a blue organic emission layer include an emission host and an emission dopant.

In addition to the organic emission layer, common layers such as an injecting layer and a transporting layer for improving luminous efficiency of the organic light emitting diode may be further disposed between the anode 131 and the cathode 133. At least some of the common layers may have a common structure commonly disposed in a plurality of sub pixels in order to take advantages in a manufacturing process.

Herein, layers having a common structure may be formed using a common mask in which all of sub pixels are open and may be laminated into the same structure in all sub pixels without a pattern for each sub pixel. That is, the layers having the common structure are disposed as being connected or extended from one sub pixel to its adjacent sub pixel without having a disconnected portion and thus shared by a plurality of sub pixels.

For example, in addition to the green organic emission layer 132, a hole injecting layer or a hole transporting layer configured to more readily move holes may be further disposed between the anode 131 and the cathode 133. The hole injecting layer or the hole transporting layer may have a common structure commonly disposed in a plurality of sub pixels. In an example embodiment, the hole transporting layer may be configured as a p-type hole transporting layer doped with a p-type dopant. Or, at least one among an electron transporting layer, an electron injecting layer, and a hole blocking layer may be further disposed between the anode 131 and the cathode 133 of the green organic light emitting element 130 in order to more smoothly move the electron into the organic light emitting layer. The electron transporting layer, the electron injecting layer, and the hole blocking layer may have a common structure which is disposed in common on the plurality of subpixels.

The organic light emitting display device 100 may have a patterned emission layer structure depending on a design. In the organic light emitting display device having the patterned emission layer structure, emission layers emitting different color lights are separated in each pixel. For example, a red organic emission layer for emitting a red light, a green organic emission layer for emitting a green light, and a blue organic emission layer for emitting a blue light may be separately disposed in a red sub pixel SR, a green sub pixel SG, and a blue sub pixel SB, respectively. In the red organic emission layer, the green organic emission layer, and the blue organic emission layer, holes and electrons supplied through the anode and the cathode are combined to emit a red light, a green light, and a blue light, respectively. Each of the organic emission layers may be deposited and patterned on each of a sub pixel through an apertured mask, e.g., an FMM (Fine Metal Mask), to emit specific color light. Such a method of arranging sub pixels using an FMM will be described later with reference to FIG. 3A through FIG. 3C.

As described above, the organic emission layers of the organic light emitting display device 100 may be deposited and patterned using FMMs. The FMMs includes open areas open to sub pixels, and the red organic emission layer, the green organic emission layer, and the blue organic emission layer may be deposited in each of the red sub pixel SR, the green sub pixel SG, and the blue sub pixel SB through the open areas of the FMMs. If a size of a sub pixel becomes small, a distance between emission areas in the sub pixel is decreased and a distance between open areas of the FMMs is also decreased. Particularly, the organic light emitting display device having the high resolution 100 has a very small pixel size, and, thus, a distance between sub pixels is very small. If the size of a sub pixel is reduced, the brightness of the sub pixel is decreased, resulting in a decrease in visibility of the organic light emitting display device 100. Thus, a higher current may be needed to output the same brightness. Therefore, it is necessary to secure a maximum size of a sub pixel in order to improve the brightness and reduce power consumption.

A bank layer 116 is disposed to define sub pixels. In detail, the bank layer 116 is disposed to cover at least a part of an edge of the anode 131 and thus expose a part of an upper surface of the anode 131.

Particularly, in the organic light emitting display device 100 according to an example embodiment of the present disclosure, a bank layer is formed as narrow as possible between sub pixels emitting the same color to secure a distance between sub pixels emitting different colors. Therefore, it is possible to relatively increase the size of each sub pixel. Further, if the size of each sub pixel is increased, the brightness is improved. Thus, a lower current and less power consumption may be needed to output the same brightness. Accordingly, the amount of current flowing to an organic emission layer is decreased and the rate of degradation of the organic emission layer is also decreased. Thus, it is possible to secure the brightness of sub pixels by supplying a low current. Also, an overall life span of the organic light emitting diode is increased, and, thus, a life span of an organic light emitting display device can be improved. Further, the size of a sub pixel may be an emission area of the sub pixel.

Figure 3A:
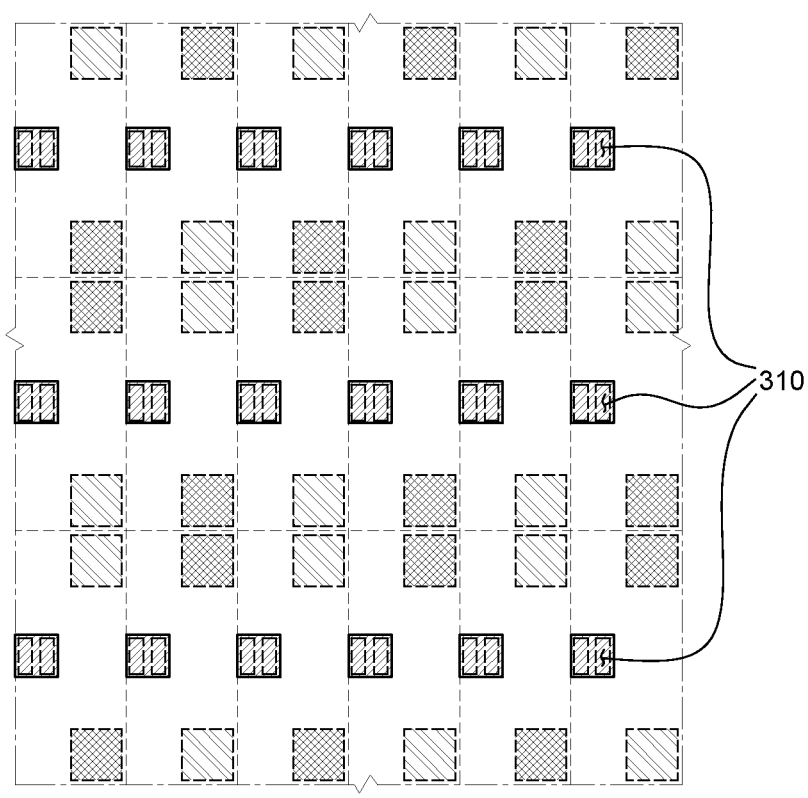
FIG. 3A through FIG. 3C are schematic plan views provided to explain a method of disposing sub pixels using an FMM in the organic light emitting display device according to an example embodiment of the present disclosure.
Figure 3B:
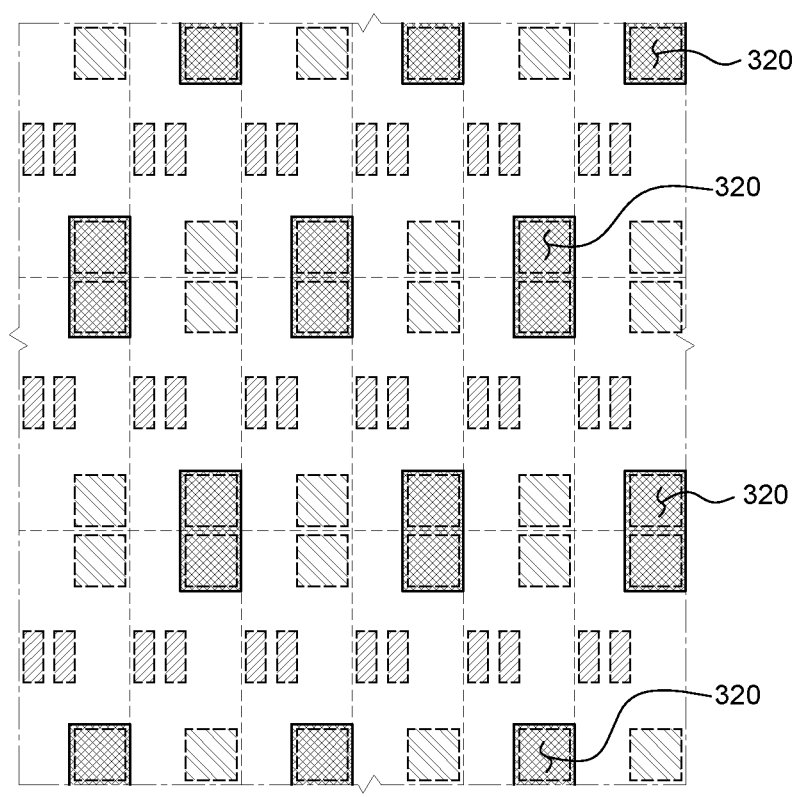
Figure 3B:
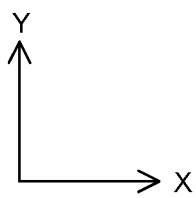
Figure 3C:
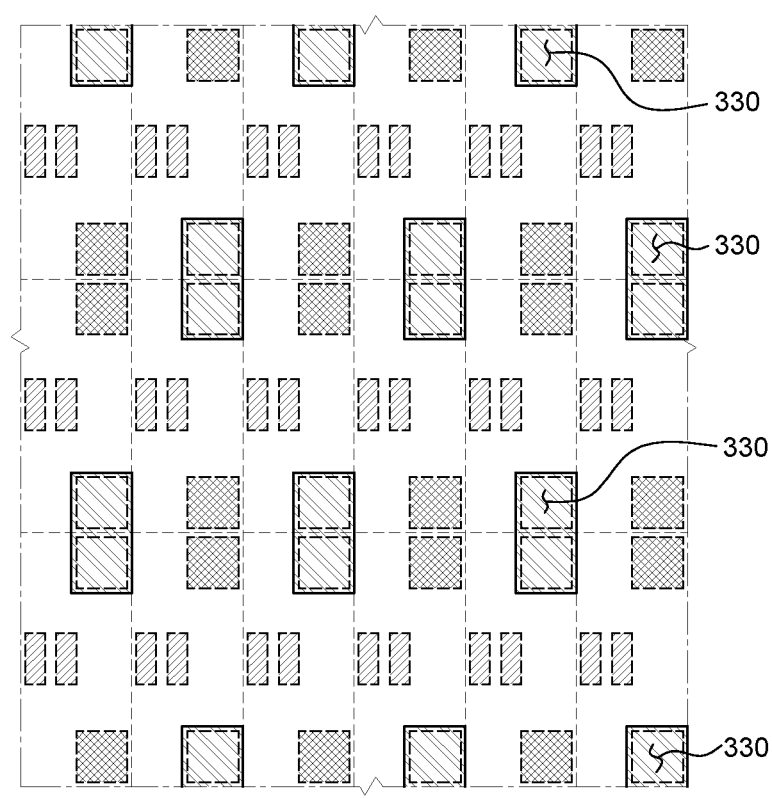

FIG. 3A through FIG. 3C are schematic plan views provided to explain a method of disposing sub pixels using an FMM in the organic light emitting display device according to an example embodiment of the present disclosure. FIG. 3A is a schematic plan view illustrating that a green sub pixel is deposited through an open area 310 of a first FMM. FIG. 3B is a schematic plan view illustrating that a red sub pixel is deposited through an open area 320 of a second FMM. FIG. 3C is a schematic plan view illustrating that a blue sub pixel is deposited through an open area 330 of a third FMM. The plan views of FIG. 3A through FIG. 3C illustrate only the open areas of the FMMs, but illustration of an overall configuration of the FMM is omitted. Further, the plan views of FIG. 3A through FIG. 3C illustrate the FMMs disposed in the organic light emitting display device 100 illustrated in FIG. 1, and the other components are substantially the same. Thus, redundant descriptions thereof will be omitted or will be briefly discussed below. FIG. 1 and FIG. 2 will be referred to for convenience in explanation.

Referring to FIG. 3A, a green sub pixel is formed through the open area 310 of the first FMM. In detail, a green organic emission layer is wholly deposited on an anode and a bank layer disposed in the green sub pixel through the open area 310 of the first FMM. Thus, even if the green organic emission layer is deposited on the bank layer, an actual emission area is equivalent to that of the plurality of green sub pixels SG1 and SG2 as illustrated in FIG. 1. That is, the plurality of green sub pixels SG1 and SG2 adjacent to each other in one pixel is formed by wholly depositing the green organic emission layer through the open area 310 of the first FMM. Herein, the open area 310 of the first FMM may have a polygonal shape. For example, the open area 310 of the first FMM has a quadrangular shape.

Referring to FIG. 3B, a red sub pixel is formed through the open area 320 of the second FMM. In detail, a red organic emission layer is wholly deposited on each of red sub pixels in adjacent pixels through the open area 320 of the second FMM. That is, since a bank layer is present between the adjacent pixels, the red organic emission layer is wholly deposited on anodes of each of the red sub pixels adjacent to each other and the bank layer between the adjacent pixels. Thus, even if the red organic emission layer is deposited on the bank layer, an actual emission area is equivalent to that of the adjacent red sub pixels spaced from each other with respect to a boundary line between the adjacent pixels as illustrated in FIG. 1. That is, the red sub pixels SR adjacent to each other in the adjacent pixels are formed by wholly depositing the red organic emission layer through the open area 320 of the second FMM. Herein, the open area 320 of the second FMM may also have a polygonal shape. For example, the open area 320 of the second FMM has a rectangular shape.

Referring to FIG. 3C, a blue sub pixel is formed through the open area 330 of the third FMM. In detail, a blue organic emission layer is wholly deposited on each of blue sub pixels in adjacent pixels through the open area 330 of the third FMM. That is, since a bank layer is present between the adjacent pixels, the blue organic emission layer is wholly deposited on anodes of each of the blue sub pixels adjacent to each other and the bank layer between the adjacent pixels. Thus, even if the blue organic emission layer is deposited on the bank layer, an actual emission area is equivalent to that of the adjacent blue sub pixels spaced from each other with respect to the boundary line between the adjacent pixels as illustrated in FIG. 1. That is, the blue sub pixels SB adjacent to each other in the adjacent pixels are formed by wholly depositing the blue organic emission layer through the open area 330 of the third FMM. Herein, the open area 330 of the third FMM may also have a polygonal shape. For example, the open area 330 of the third FMM has a rectangular shape.

In the organic light emitting display device 100 according to an example embodiment of the present disclosure, each of the plurality of green sub pixels SG1 and SG2 and the red sub pixels and blue sub pixels disposed adjacent to each other between the adjacent pixels is deposited on a sub pixel through an open area of an FMM. An organic emission layer deposited through the open area of the one FMM includes a non-emission area which does not actually emit a light due to a bank layer. Thus, the plurality of green sub pixels SG1 and SG2, the red sub pixel SR, and the blue sub pixel SB are formed as illustrated in FIG. 1. That is, sub pixels disposed adjacent to each other and emitting the same color can be formed through an open area of an FMM, and, thus, a distance between open areas of FMMs emitting the same color light can be secured. Therefore, the open areas of the FMMs emitting the same color can be increased and the size of the sub pixel can be increased.

Figure 4:
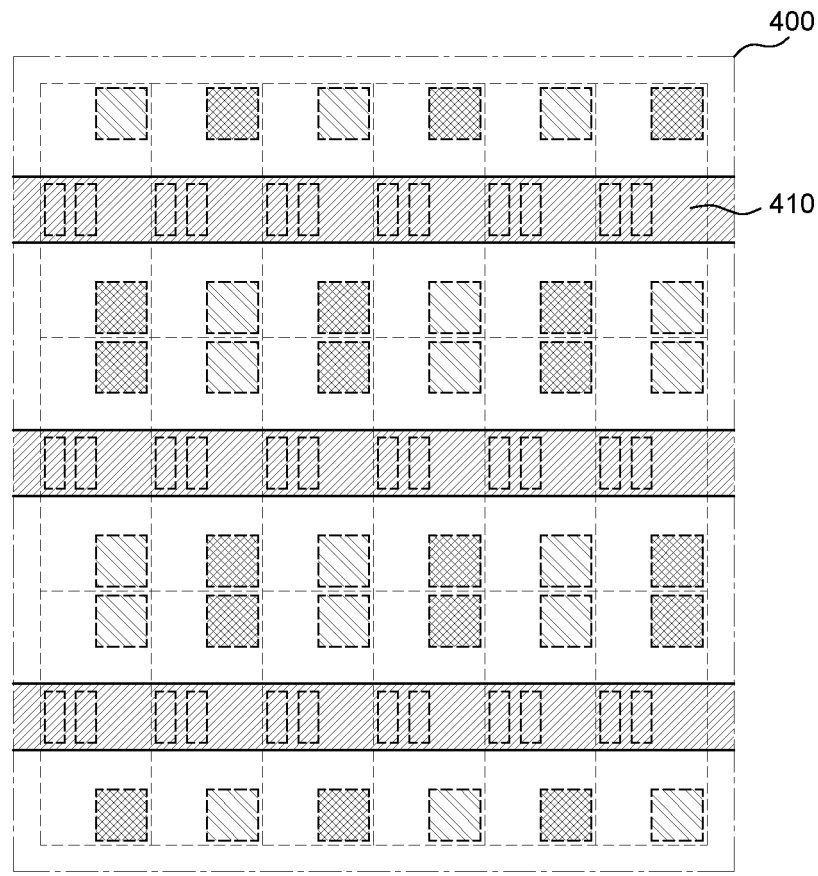
FIG. 4 is a schematic plan view provided to explain a method of disposing sub pixels using an FMM in an organic light emitting display device according to another example embodiment of the present disclosure.

FIG. 4 is a schematic plan view provided to explain a method of disposing sub pixels using an FMM in an organic light emitting display device according to another example embodiment of the present disclosure. The plan view of FIG. 4 is different from the plan view of FIG. 3A only in shape of an open area of an FMM, and the other components are substantially the same. Thus, redundant descriptions thereof will be omitted or will be briefly discussed below. FIG. 1 and FIG. 2 will be referred to for convenience in explanation.

Referring to FIG. 4, a green sub pixel is formed through an open area 410 of a fourth FMM. In detail, the fourth FMM 400 includes a plurality of open areas 410, and each of the plurality of open areas 410 of the fourth FMM 400 has a rectangular shape extended in the X-axis direction. The open area 410 of the fourth FMM 400 may be formed to cover all of the plurality of green sub pixels SG1 and SG2 disposed in each of a plurality of pixels disposed in the X-axis direction. Thus, a green organic emission layer is wholly deposited on the plurality of green sub pixels in each of the plurality of pixels disposed in the X-axis direction through the open area 410 of the fourth FMM 400.

Thus, even if the green organic emission layer is deposited on the bank layer, an actual emission area is equivalent to that of the adjacent green sub pixels spaced from each other with respect to the boundary line between the adjacent pixels as illustrated in FIG. 1. That is, even if the green organic emission layer is deposited on the bank layer over the plurality of pixels disposed in the X-axis direction, an actual emission area is equivalent to that of the plurality of green sub pixels SG1 and SG2 as illustrated in FIG. 1.

In the organic light emitting display device 100 according to an example embodiment of the present disclosure, the plurality of green sub pixels SG1 and SG2 in the pixels disposed in the X-axis direction is deposited on a sub pixel through an open area of an FMM. An organic emission layer deposited through the open area of the FMM includes a non-emission area which does not actually emit a light due to a bank layer. Thus, the plurality of green sub pixels SG1 and SG2 are formed as illustrated in FIG. 1. As such, the plurality of green sub pixels SG1 and SG2 can be formed in the X-axis direction at a time. Therefore, it is possible to more readily form an open area of an FMM and also possible to more simplify a manufacturing process.

Figure 5:
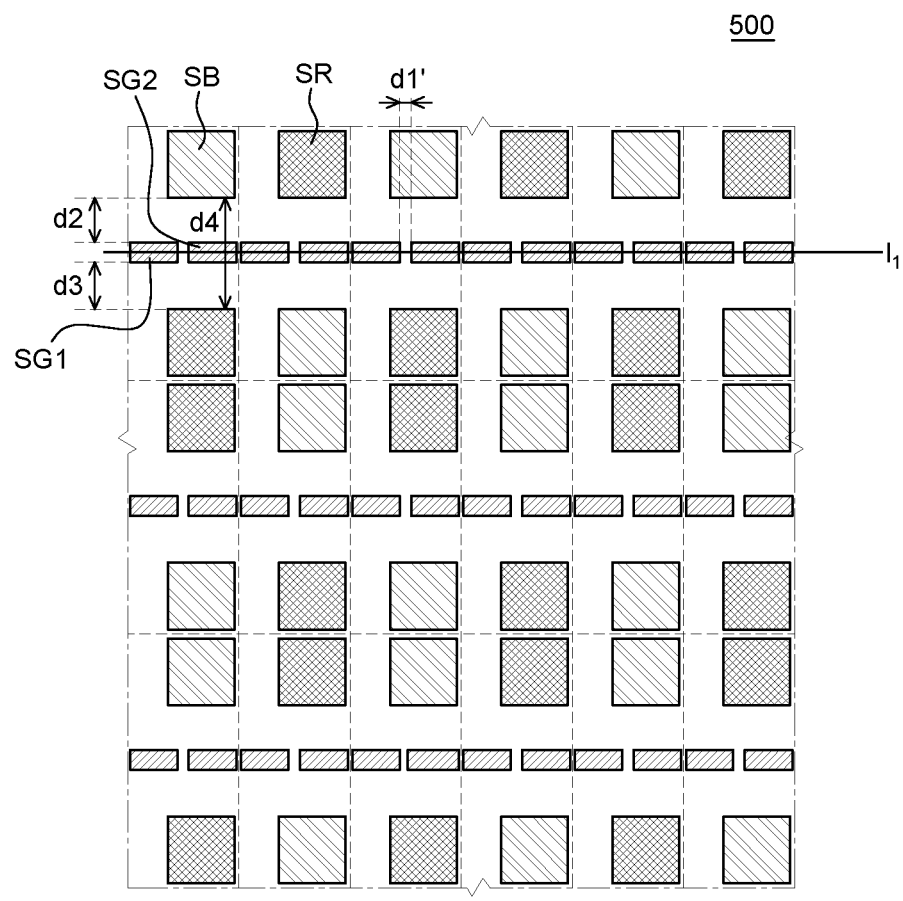
FIG. 5 is a schematic plan view provided to explain an organic light emitting display device according to another example embodiment of the present disclosure.

FIG. 5 is a schematic plan view provided to explain an organic light emitting display device according to another example embodiment of the present disclosure. An organic light emitting display device 500 illustrated in FIG. 5 according to another example embodiment of the present disclosure is different from the organic light emitting display device 100 illustrated in FIG. 1 only in shape and disposal of the plurality of green sub pixels SG1 and SG2 in a pixel and size of the red sub pixel SR and the blue sub pixel SB, and the other components are substantially the same. Thus, redundant descriptions thereof will be omitted or will be briefly discussed below.

Referring to FIG. 5, the plurality of green sub pixels SG1 and SG2 in each of the plurality of pixels are disposed on the first line $l_1$ extended in the X-axis direction and a line parallel to the first line $l_1$. In each of the plurality of pixels, each of the plurality of green sub pixels SG1 and SG2 has a rectangular shape. Particularly, the rectangular shape has long sides parallel to the first line $l_1$. In FIG. 5, the plurality of green sub pixels SG1 and SG2 in each of the plurality of pixels are disposed end to end, which is different from that of FIG. 1, where the plurality of green sub pixels SG1 and SG2 in each of the plurality of pixels are disposed side by side.

In one pixel, the plurality of green sub pixels SG1 and SG2 may be disposed as being spaced as far as possible from the red sub pixel SR and the blue sub pixel SB. In detail, in a reference pixel among the plurality of pixels, a distance $d_2$ between the blue sub pixel SB and the plurality of green sub pixels SG1 and SG2, a distance $d_3$ between the red sub pixel SR and the plurality of green sub pixels SG1 and SG2, and a distance $d_4$ between the red sub pixel SR and the blue sub pixel SB are greater than a distance $d_1'$ between the plurality of green sub pixels SG1 and SG2. For example, the distance $d_2$ between the blue sub pixel SB and the plurality of green sub pixels SG1 and SG2 may be equal to the distance $d_3$ between the red sub pixel SR and the plurality of green sub pixels SG1 and SG2, and the plurality of green sub pixels SG1 and SG2 may be disposed in the middle of the pixel.

In the organic light emitting display device 500 according to another example embodiment of the present disclosure, the two green sub pixels SG1 and SG2 are disposed on the first line $l_1$ and have a rectangular shape extended in the X-axis direction. Thus, the distance $d_2$ between the blue sub pixel SB and the plurality of green sub pixels SG1 and SG2 and the distance $d_3$ between the red sub pixel SR and the plurality of green sub pixels SG1 and SG2 may be substantially increased. That is, the size of the blue sub pixel SB and the red sub pixel SR can be increased as much as a distance between sub pixels emitting different color lights can be increased. Therefore, since the size of a sub pixel can be increased, it may become easier to arrange sub pixels in the organic light emitting display device having a high-resolution.

Figure 6:
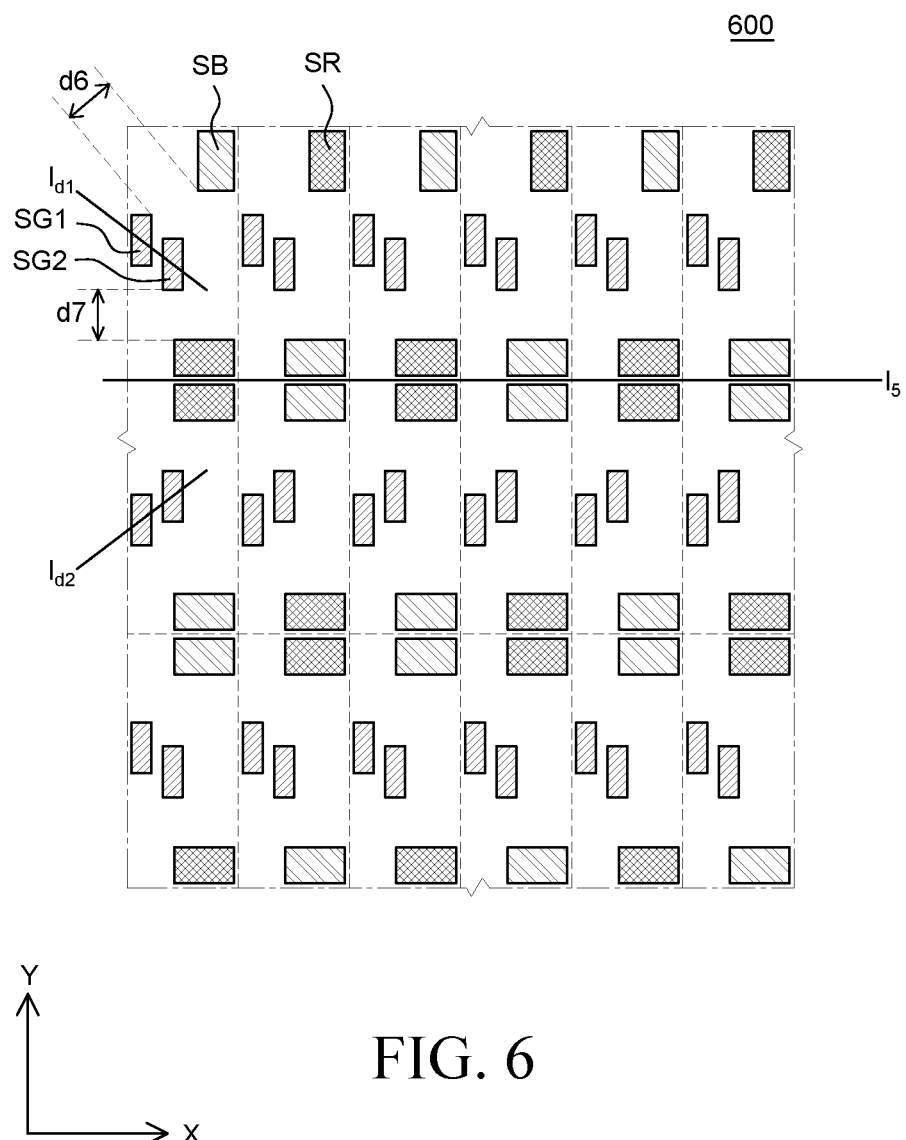
FIG. 6 is a schematic plan view provided to explain an organic light emitting display device according to another example embodiment of the present disclosure.

FIG. 6 is a schematic plan view provided to explain an organic light emitting display device according to another example embodiment of the present disclosure. An organic light emitting display device 600 illustrated in FIG. 6 according to another example embodiment of the present disclosure is different from the organic light emitting display device 100 illustrated in FIG. 1 only in disposal of the two green sub pixels SG1 and SG2 and shape of the red sub pixel SR and the blue sub pixel SB, and the other components are substantially the same. Thus, redundant descriptions thereof will be omitted or will be briefly discussed below.

Referring to FIG. 6, in one pixel, the plurality of green sub pixels SG1 and SG2 is disposed in a diagonal direction, that is, offset in a first direction. In detail, if a reference pixel is a pixel in which the blue sub pixel SB is disposed on an upper side and the red sub pixel SR is disposed on a lower side with respect to any one among the plurality of green sub pixels SG1 and SG2, a line connecting the centers of the plurality of green sub pixels SG1 and SG2 is a first diagonal line $l_{d1}$ parallel to a first diagonal direction D1. Likewise, in the reference pixel, if the red sub pixel SR is disposed on an upper side and the blue sub pixel SB is disposed on a lower side with respect to any one among the plurality of green sub pixels SG1 and SG2, a line connecting the centers of the plurality of green sub pixels SG1 and SG2 is a second diagonal line $l_{d2}$ parallel to a second diagonal direction D2. The first diagonal line $l_{d1}$ and the second diagonal line $l_{d2}$ are symmetric to each other with respect to the fifth line $l_5$ parallel to the X-axis. That is, in an adjacent pixel adjacent to the reference pixel in the Y-axis direction, each of the plurality of green sub pixels SG1 and SG2 is symmetric to each other. In other words, in the reference pixel, the first diagonal line connecting the centers of each of the plurality of green sub pixels SG1 and SG2 may be extended from the first line in the diagonal direction. And, in the adjacent pixel, the second diagonal line connecting the centers of each of the plurality of first sub pixels and the first diagonal line may be symmetric to each other with respect to a boundary line.

Referring to FIG. 6, since the plurality of green sub pixels SG1 and SG2 is disposed in the first diagonal direction D1 or the second diagonal direction D2, the red sub pixel SR and the blue sub pixel SB are formed so as to secure a distance between sub pixels emitting different color lights in one pixel. In detail, the shape and arrangement of the red sub pixel SR and the blue sub pixel SB are determined such that a minimum distance $d_6$ between the blue sub pixel SB and the plurality of green sub pixels SG1 and SG2 and a minimum distance $d_7$ between the red sub pixel SR and the plurality of green sub pixels SG1 and SG2 can satisfy a distance required for a deposition process of an organic emission layer using an FMM and the size of the red sub pixel SR and the blue sub pixel SB can be maximized.

Accordingly, the red sub pixel SR and the blue sub pixel SB may have rectangular shapes extended in different directions. For example, in a reference pixel in which the blue sub pixel SB is disposed on an upper side and the red sub pixel SR is disposed on a lower side with respect to any one among the plurality of green sub pixels SG1 and SG2, the blue sub pixel SB is formed into a rectangular shape of which long sides are parallel to the Y-axis direction in order to secure the minimum distance $d_6$ between the blue sub pixel SB and the plurality of green sub pixels SG1 and SG2. And, the red sub pixel SR is formed into a rectangular shape of which long sides are parallel to the X-axis direction in order to secure the minimum distance $d_7$ between the red sub pixel SR and the plurality of green sub pixels SG1 and SG2. Likewise, in the reference pixel in which the red sub pixel SR is disposed on an upper side and the blue sub pixel SB is disposed on a lower side with respect to any one among the plurality of green sub pixels SG1 and SG2, the red sub pixel SR is formed into a rectangular shape of which long sides are parallel to the Y-axis direction in order to secure the minimum distance between the red sub pixel SR and the plurality of green sub pixels SG1 and SG2. And, the blue sub pixel SB is formed into a rectangular shape of which long sides are parallel to the X-axis direction in order to secure the minimum distance between the blue sub pixel SB and the plurality of green sub pixels SG1 and SG2.

In the organic light emitting display device 600 according to another example embodiment of the present disclosure, a line connecting the centers of the two green sub pixels SG1 and SG2 is adjusted as the first diagonal line $l_{d1}$ or the second diagonal line $l_{d2}$. Thus, the two green sub pixels SG1 and SG2 are disposed in the first diagonal direction D1 or the second diagonal direction D2. Therefore, in one pixel, the red sub pixel SR and the blue sub pixel SB may have rectangular shapes extended in different directions in order to secure a distance between the blue sub pixel SB and the plurality of green sub pixels SG1 and SG2 and a distance between the red sub pixel SR and the plurality of green sub pixels SG1 and SG2. Accordingly, the shape and arrangement of the red sub pixel SR and the blue sub pixel SB may vary according to various methods of arranging the plurality of green sub pixels SG1 and SG2. Thus, it may become easier to arrange sub pixels in the organic light emitting display device having a high-resolution.

Figure 7A:
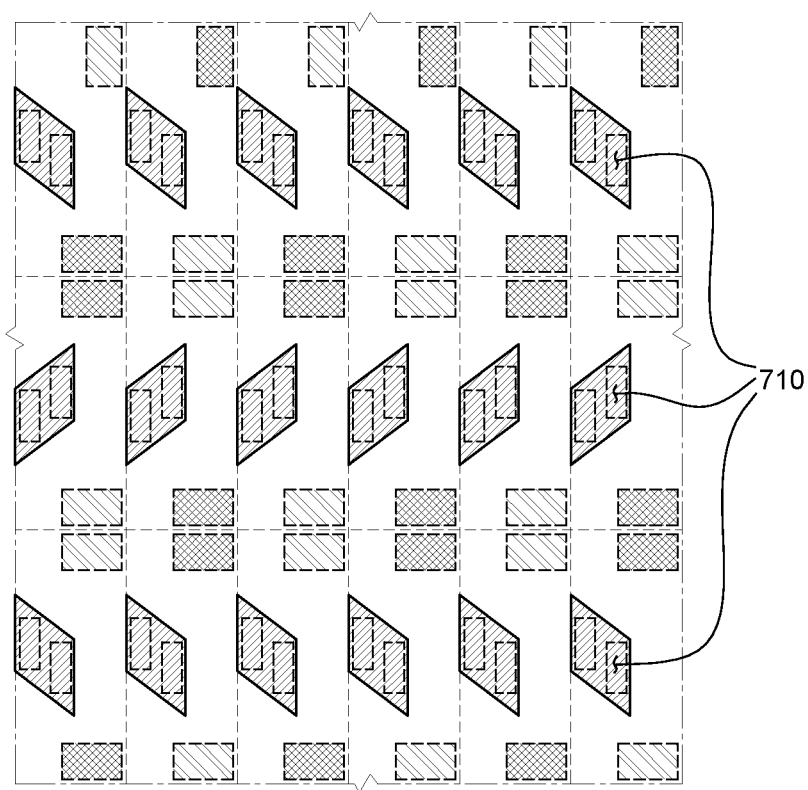
FIG. 7A through FIG. 7C are schematic plan views provided to explain a method of disposing sub pixels using an FMM in the organic light emitting display device according to another example embodiment of the present disclosure.
Figure 7A:
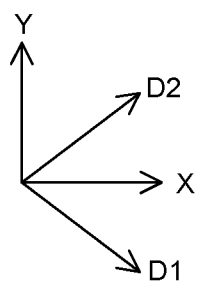
Figure 7B:
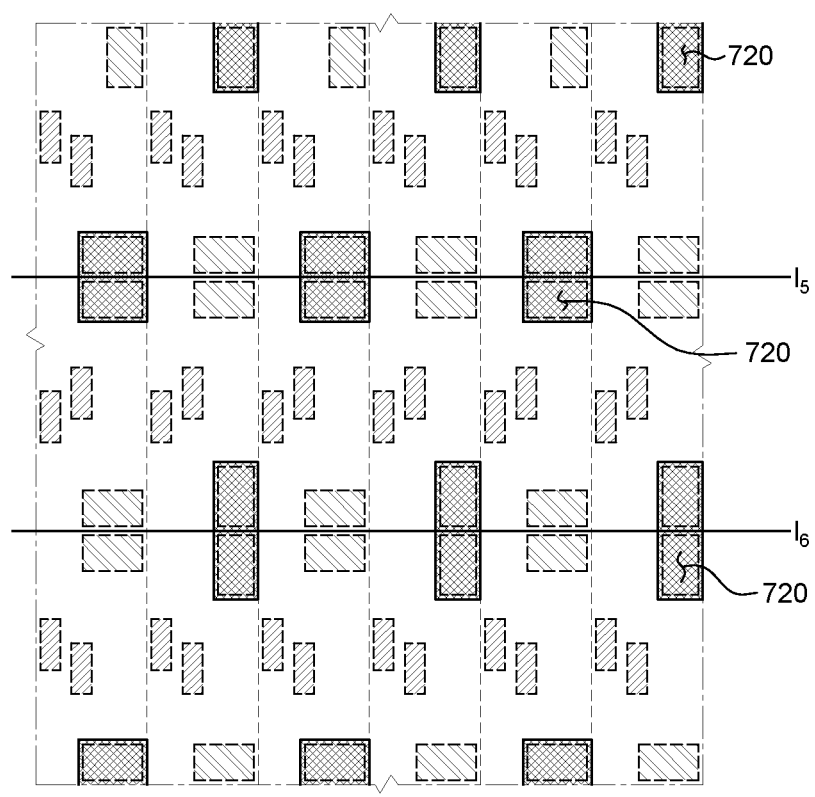
Figure 7C:
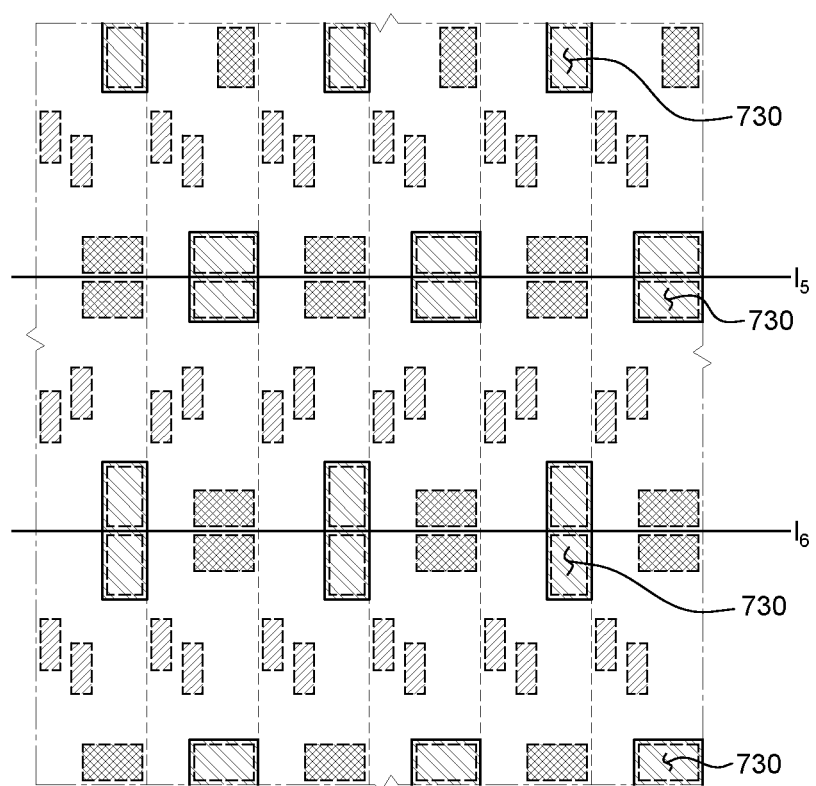

FIG. 7A through FIG. 7C are schematic plan views provided to explain a method of arranging sub pixels using an FMM in the organic light emitting display device according to another example embodiment of the present disclosure. FIG. 7A is a schematic plan view illustrating that a green sub pixel is deposited through an open area 710 of a fifth FMM. FIG. 7B is a schematic plan view illustrating that a red sub pixel is deposited through an open area 720 of a sixth FMM. FIG. 7C is a schematic plan view illustrating that a blue sub pixel is deposited through an open area 730 of a seventh FMM. The open areas 710, 720, and 730 of the FMMs illustrated in FIG. 7A through FIG. 7C are different in shape from the open areas 310, 320, and 330 of the FMMs illustrated in FIG. 3A through FIG. 3C, but the other components are substantially the same. Thus, redundant descriptions thereof will be omitted or will be briefly discussed below. FIG. 6 will be referred to for convenience in explanation.

Referring to FIG. 7A, a green sub pixel is formed through the open area 710 of the fifth FMM. Herein, the open area 710 of the fifth FMM may have a parallelogram shape or a diamond shape (or a rhombus shape). In detail, a green organic emission layer is wholly deposited on an anode and a bank layer disposed in the green sub pixel through the open area 710 of the fifth FMM. However, an organic emission layer in an area on a bank layer does not emit a light. Thus, even if the green organic emission layer is deposited into a parallelogram shape or a diamond shape (or a rhombus shape) by patterning the bank layer, an actual emission area is equivalent to that of the plurality of rectangular green sub pixels SG1 and SG2 as illustrated in FIG. 6. That is, the plurality of green sub pixels SG1 and SG2 adjacent to each other in one pixel has a rectangular shape and is disposed in the first diagonal direction D1 or the second diagonal direction D2.

Referring to FIG. 7B, a red sub pixel is formed through the open area 720 of the sixth FMM. Herein, the open area 720 of the sixth FMM may have a rectangular shape. In detail, the open area 720 of the sixth FMM may have a different rectangular shape on each boundary line adjacent to each other in the Y-axis direction. As for a fifth line $l_5$ and a sixth line $l_6$ as boundary lines parallel to the X-axis direction, a short line of the open area 720 of the sixth FMM disposed on the fifth line $l_5$ is greater than a short line of the open area 720 of the sixth FMM disposed on the sixth line $l_6$.

Referring to FIG. 7C, a blue sub pixel is formed through the open area 730 of the seventh FMM. Herein, the open area 730 of the seventh FMM may have a rectangular shape. In detail, the open area 730 of the seventh FMM may have a different rectangular shape on each boundary line adjacent to each other in the Y-axis direction. As for the fifth line $l_5$ and the sixth line $l_6$ as boundary lines parallel to the X-axis direction, a short line of the open area 730 of the seventh FMM disposed on the fifth line $l_5$ is greater than a short line of the open area 730 of the seventh FMM disposed on the sixth line $l_6$. In FIGS. 7B and 7C, the plurality of red sub pixels and the plurality of blue sub pixels in adjacent pixels may be disposed end to end, or side by side.

In the organic light emitting display device according to an example embodiment of the present disclosure, each of the plurality of green sub pixels SG1 and SG2 is deposited on a sub pixel through parallelogram-shaped or diamond-shaped (or rhombus-shaped) open area of an FMM. Further, each of the plurality of green sub pixels SG1 and SG2 is formed into a rectangular shape by a bank layer and the plurality of green sub pixels SG1 and SG2 is disposed in the first diagonal direction D1 or the second diagonal direction D2. That is, since the FMM including the open area having a parallelogram shape or a diamond shape (or a rhombus shape) rather than a rectangular shape is used, the plurality of green sub pixels SG1 and SG2 can be disposed at various angles. Since the plurality of green sub pixels SG1 and SG2 can be disposed variously, the red sub pixel SR and the blue sub pixel SB may be formed into various shapes so as to increase the size of a sub pixel.

Figure 8:
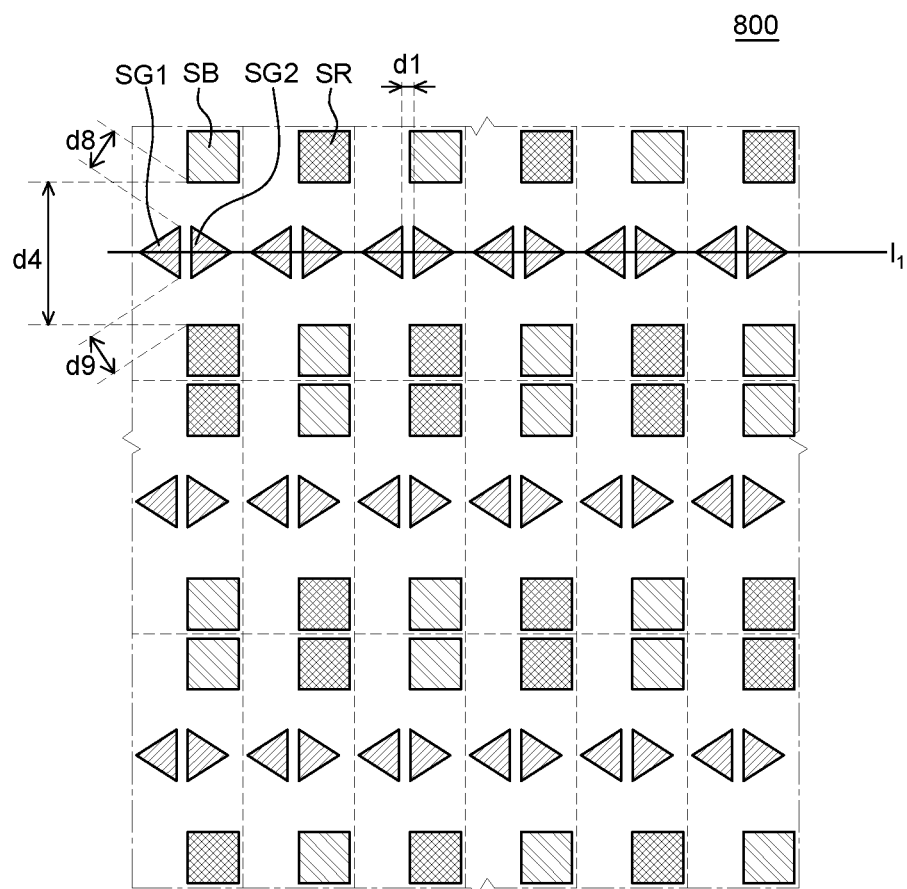
FIG. 8 is a schematic plan view provided to explain an organic light emitting display device according to another example embodiment of the present disclosure.

FIG. 8 is a schematic plan view provided to explain an organic light emitting display device according to another example embodiment of the present disclosure. An organic light emitting display device 800 illustrated in FIG. 8 according to another example embodiment of the present disclosure is different from the organic light emitting display device 100 illustrated in FIG. 1 in shape of the two green sub pixels SG1 and SG2 in a pixel, and the other components are substantially the same. Thus, redundant descriptions thereof will be omitted or will be briefly discussed below.

Referring to FIG. 8, in each of a plurality of pixels, the plurality of green sub pixels SG1 and SG2 is disposed on the first line $l_1$ extended in the X-axis direction and the line parallel to the first line $l_1$. In each of the plurality of pixels, the plurality of green sub pixels SG1 and SG2 has triangular shapes. In each of the plurality of pixels, the plurality of green sub pixels SG1 and SG2 are symmetric to each other.

In one pixel, the plurality of green sub pixels SG1 and SG2 may be disposed as being spaced as far as possible from the red sub pixel SR and the blue sub pixel SB. In detail, a distance $d_8$ between the blue sub pixel SB and the plurality of green sub pixels SG1 and SG2, a distance $d_9$ between the red sub pixel SR and the plurality of green sub pixels SG1 and SG2, and the distance $d_4$ between the red sub pixel SR and the blue sub pixel SB are greater than a distance $d_1$ between the plurality of green sub pixels SG1 and SG2. For example, the distance $d_8$ between the blue sub pixel SB and the plurality of green sub pixels SG1 and SG2 may be equal to the distance $d_9$ between the red sub pixel SR and the plurality of green sub pixels SG1 and SG2.

Referring to FIG. 8, the plurality of green sub pixels SG1 and SG2 may be disposed in the middle of a pixel so as to be spaced as far as possible from the red sub pixel SR and the blue sub pixel SB. Further, each of the red sub pixel SR and the blue sub pixel SB may be disposed to be equispaced from the plurality of green sub pixels SG1 and SG2 in a reference pixel and the plurality of green sub pixels SG1 and SG2 in a pixel adjacent to the reference pixel in the X-axis direction. In detail, each of the red sub pixel SR and the blue sub pixel SB may be disposed on a straight line orthogonal to the middle between the second green sub pixel SG2 in the reference pixel and the first green sub pixel SG1 in the pixel adjacent to the reference pixel in the X-axis direction on the first line $l_1$.

And, the plurality of green sub pixels SG1 and SG2 are formed into a triangular shape. Thus, the red sub pixel SR and the blue sub pixel SB may also be formed into a diamond shape (or a rhombus shape) or a square shape so as to secure a distance between sub pixels emitting different color lights and maximize the size of a sub pixel. That is, the shape of a sub pixel may be determined so as to secure the maximum size of the sub pixel, and the shape and the size of each sub pixel may be modified variously depending on an example embodiment.

In the organic light emitting display device 800 according to another example embodiment of the present disclosure, the two green sub pixels SG1 and SG2 having a triangular shape are disposed on the first line $l_1$. Thus, the distance $d_8$ between the blue sub pixel SB and the plurality of green sub pixels SG1 and SG2 and the distance $d_9$ between the red sub pixel SR and the plurality of green sub pixels SG1 and SG2 may be substantially increased. That is, the size of the blue sub pixel SB and the red sub pixel SR can be increased as much as a distance between the sub pixels emitting different color lights can be increased. Therefore, since the size of a sub pixel can be increased, it may become easier to arrange sub pixels in the organic light emitting display device having a high-resolution.

Figure 9:
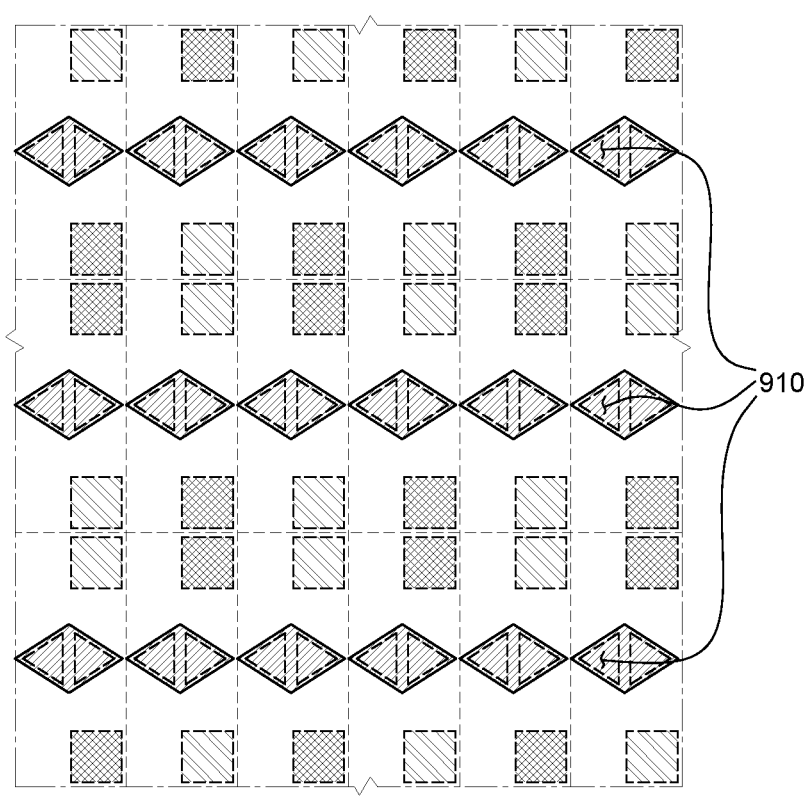
FIG. 9 is a schematic plan view provided to explain a method of disposing sub pixels using an FMM in an organic light emitting display device according to another example embodiment of the present disclosure.

FIG. 9 is a schematic plan view provided to explain a method of disposing sub pixels using an FMM in an organic light emitting display device according to another example embodiment of the present disclosure. FIG. 9 is a schematic plan view illustrating that a green sub pixel is deposited through an open area 910 of an eighth FMM. Each open area 910 of the FMM illustrated in FIG. 9 is different in shape from each open area 710 of the FMM illustrated in FIG. 7A, but the other components are substantially the same. Thus, redundant descriptions thereof will be omitted or will be briefly discussed below. FIG. 8 will be referred to for convenience in explanation.

Referring to FIG. 9, a green sub pixel is formed through the open area 910 of the eighth FMM. Herein, the open area 910 of the eighth FMM may have a diamond (or rhombus) shape or a square shape. In detail, a green organic emission layer is wholly deposited on an anode and a bank layer disposed in the green sub pixel through the open area 910 of the eighth FMM. However, an area on a bank layer does not emit a light. Thus, even if the green organic emission layer is deposited into a diamond (or rhombus) shape or a square shape by patterning the bank layer, an actual emission area is equivalent to that of the plurality of triangular green sub pixels SG1 and SG2 as illustrated in FIG. 8. That is, the plurality of green sub pixels SG1 and SG2 adjacent to each other in one pixel has a triangular shape and is symmetric to each other.

In the organic light emitting display device according to another example embodiment of the present disclosure, each of the plurality of green sub pixels SG1 and SG2 is deposited on a sub pixel through a diamond-shaped (or a rhombus-shaped) or square-shaped open area of an FMM. Thus, the plurality of green sub pixels SG1 and SG2 has triangular shapes symmetric to each other. As such, the plurality of green sub pixels SG1 and SG2 are formed into a triangular shape, and, thus, the red sub pixel SR and the blue sub pixel SB may be formed into various shapes, such as a diamond shape (or a rhombus shape) or a square shape, so as to maximize the size of each sub pixel.

Figure 10:
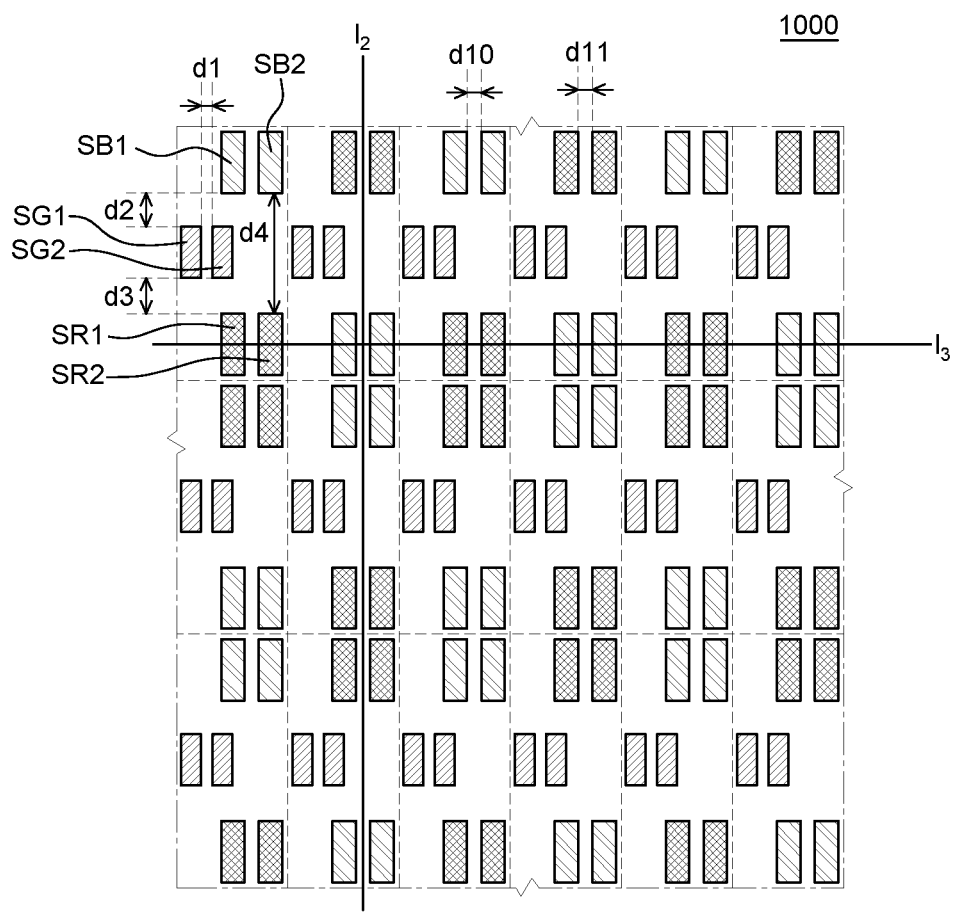
FIG. 10 is a schematic plan view provided to explain an organic light emitting display device according to another example embodiment of the present disclosure.

FIG. 10 is a schematic plan view provided to explain an organic light emitting display device according to another example embodiment of the present disclosure. An organic light emitting display device 1000 illustrated in FIG. 10 is different from the organic light emitting display device 100 illustrated in FIG. 1 in that each of the red sub pixel SR and the blue sub pixel SB is divided and spaced, and the other components are substantially the same. Thus, redundant descriptions thereof will be omitted or will be briefly discussed below.

Referring to FIG. 10, each of a plurality of pixels may include a plurality of red sub pixels and a plurality of blue sub pixels. In detail, red sub pixel includes two red sub pixels including a first red sub pixel SR1 and a second red sub pixel SR2. Blue sub pixel includes two blue sub pixels including a first blue sub pixel SB1 and a second blue sub pixel SB2. A bank layer may separate the first red sub pixel SR1 from the second red sub pixel SR2 and the first blue sub pixel SB1 from the second blue sub pixel SB2, respectively.

In each of the plurality of pixels, the first red sub pixel SR1 and the second red sub pixel SR2 are symmetric to each other, and the first blue sub pixel SB1 and the second blue sub pixel SB2 are symmetric to each other. In detail, in one pixel, the first red sub pixel SR1 and the second red sub pixel SR2 are symmetric to each other with respect to the second line $l_2$ extended in the Y-axis direction and the line parallel to the second line $l_2$. Likewise, the first blue sub pixel SB1 and the second blue sub pixel SB2 are also symmetric to each other with respect to the second line $l_2$ extended in the Y-axis direction and the line parallel to the second line $l_2$.

Referring to FIG. 10, in each of the plurality of pixels, the red sub pixel SR and the blue sub pixel SB are disposed on the third line $l_3$ parallel to the X-axis direction and the line parallel to the third line. In detail, in a plurality of pixels disposed in the X-axis direction, sub pixels on the third line $l_3$ and the line parallel to the third line are disposed in sequence of red-red-blue-blue-red-red-blue-blue and so on. That is, two red sub pixels SR and two blue sub pixels SB on the third line $l_3$ parallel to the first line $l_1$ extended in the X-axis direction are alternately disposed as two sub pixels.

In one pixel, the plurality of green sub pixels SG1 and SG2 may be disposed as being spaced as far as possible from the red sub pixel SR and the blue sub pixel SB. Further, a distance between sub pixels emitting the same color may be smaller than a distance between sub pixels emitting different colors. In detail, the distance $d_1$ between the plurality of green sub pixels SG1 and SG2, a distance $d_{10}$ between the plurality of blue sub pixels SB1 and SB2, and a distance $d_{11}$ between the plurality of red sub pixels SR1 and SR2 may be smaller than a distance $d_2$ between the plurality of blue sub pixels SB1 and SB2 and the plurality of green sub pixels SG1 and SG2, a distance $d_3$ between the plurality of red sub pixels SR1 and SR2 and the plurality of green sub pixels SG1 and SG2, and a distance $d_4$ between the plurality of red sub pixels SR1 and SR2 and the plurality of blue sub pixels SB1 and SB2, respectively.

As such, a distance between sub pixels emitting the same color can be minimized regardless of a FMM margin since an organic emission layer is deposited through an open area of an FMM and a plurality of sub pixels is separated and spaced by a bank layer. Therefore, the size of each of a plurality of sub pixels can be further increased, and, thus, the overall brightness of an organic light emitting display device can be increased.

Further, similar to the plurality of green sub pixels SG1 and SG2, the plurality of red sub pixels SR1 and SR2 and the plurality of blue sub pixels SB1 and SB2 may be driven independently from each other by different thin film transistors which share one data line but are connected to different gate lines, respectively. Since the sub pixels emitted independently from each other can be formed to the same size, it may become easier to arrange pixels in the organic light emitting display device having a high-resolution and the degree of freedom in arranging pixels can be secured.

In the organic light emitting display device 1000 according to another example embodiment of the present disclosure, similar to a green sub pixel, a red sub pixel and a blue sub pixel may be configured as being divided into two or more parts in addition to the two green sub pixels SG1 and SG2. Thus, it is possible to increase the size of a sub pixel while minimizing a distance between sub pixels emitting the same color. Further, since a sub pixel is divided into smaller parts and each sub pixel is connected to a different driving thin film transistor, it is possible to further reduce the unit of a pixel and also possible to greatly improve the resolution of an organic light emitting display device.

Figure 11:
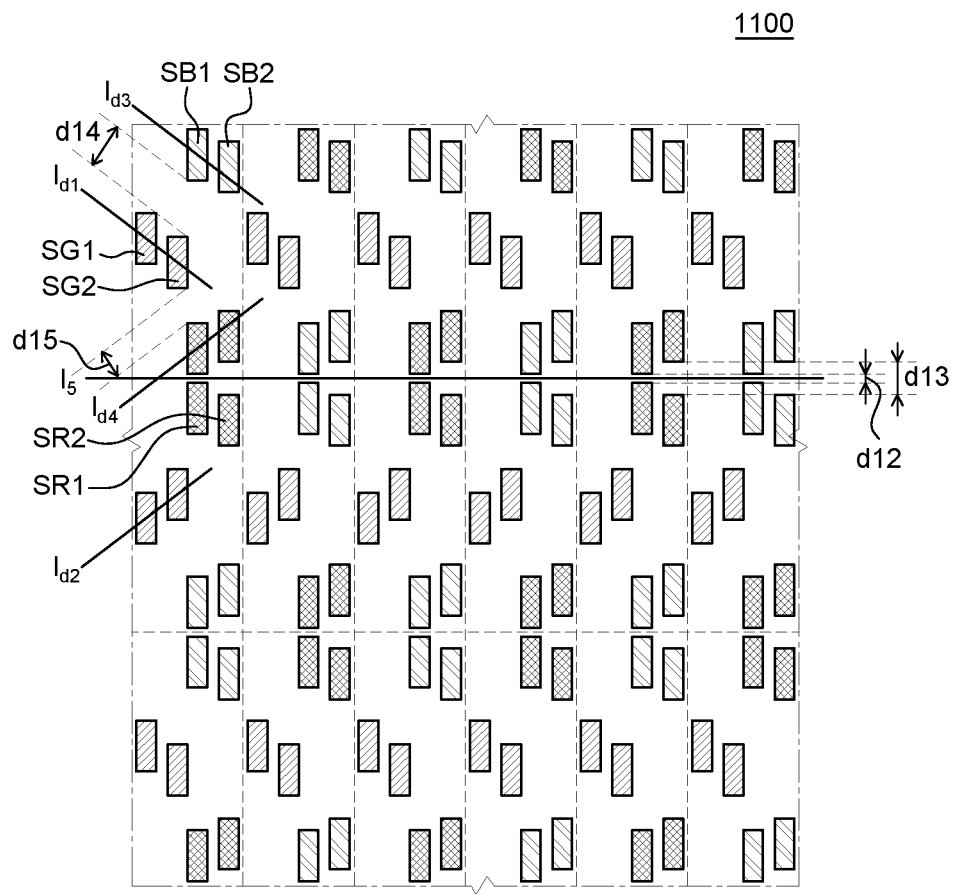
FIG. 11 is a schematic plan view provided to explain an organic light emitting display device according to another example embodiment of the present disclosure.

FIG. 11 is a schematic plan view provided to explain an organic light emitting display device according to another example embodiment of the present disclosure. An organic light emitting display device 1100 illustrated in FIG. 11 is different from the organic light emitting display device 1000 illustrated in FIG. 10 in configuration and disposal of the plurality of green sub pixels SG1 and SG2, the plurality of red sub pixels SR1 and SR2 and the plurality of blue sub pixels SB1 and SB2, and the other components are substantially the same. Thus, redundant descriptions thereof will be omitted or will be briefly discussed below. Further, the arrangement of the plurality of green sub pixels SG1 and SG2 in the organic light emitting display device 1100 illustrated in FIG. 11 is substantially the same as the arrangement of the plurality of green sub pixels SG1 and SG2 in the organic light emitting display device 600 illustrated in FIG. 6. Thus, redundant descriptions thereof will be omitted or will be briefly discussed below.

Referring to FIG. 11, the plurality of red sub pixels SR1 and SR2 and the plurality of blue sub pixels SB1 and SB2 are disposed in different diagonal directions, respectively, in one pixel. In detail, in a reference pixel, if the plurality of blue sub pixels SB1 and SB2 is disposed on an upper side and the plurality of red sub pixels SR1 and SR2 is disposed on a lower side with respect to any one among the plurality of green sub pixels SG1 and SG2, a line connecting the centers of the plurality of blue sub pixels SB1 and SB2 is a third diagonal line $l_{d3}$ parallel to the first diagonal direction D1 and a line connecting the centers of the plurality of red sub pixels SR1 and SR2 is a fourth diagonal line $l_{d4}$ parallel to the second diagonal direction D2. Likewise, if the reference pixel is a pixel in which the plurality of red sub pixels SR1 and SR2 is disposed on an upper side and the plurality of blue sub pixels SB1 and SB2 is disposed on a lower side with respect to any one of the plurality of green sub pixels SG1 and SG2, the centers of the plurality of red sub pixels SR1 and SR2 are connected on the third diagonal line $l_{d3}$ parallel to the first diagonal direction D1 and the centers of the plurality of blue sub pixels SB1 and SB2 are connected on the fourth diagonal line $l_{d4}$ parallel to the second diagonal direction D2.

Further, the third diagonal line $l_{d3}$ and the fourth diagonal line $l_{d4}$ may be symmetric to each other. That is, each of the plurality of green sub pixels SG1 and SG2, the plurality of red sub pixels SR1 and SR2, and the plurality of blue sub pixels SB1 and SB2 are symmetric in an adjacent pixel adjacent to the reference pixel in the Y-axis direction.

Referring to FIG. 11, the plurality of green sub pixels SG1 and SG2 is disposed in the first diagonal direction D1 or the second diagonal direction D2. Thus, the plurality of red sub pixels SR1 and SR2 and the plurality of blue sub pixels SB1 and SB2 are formed so as to secure a distance between sub pixels emitting different color lights in one pixel. In detail, the shape and disposal of the plurality of red sub pixels SR1 and SR2 and the plurality of blue sub pixels SB1 and SB2 are determined such that a minimum distance $d_{14}$ between the plurality of blue sub pixels SB1 and SB2 and the plurality of green sub pixels SG1 and SG2 and a minimum distance $d_{15}$ between the plurality of red sub pixels SR1 and SR2 and the plurality of green sub pixels SG1 and SG2 can satisfy a distance required for a deposition process of an organic emission layer using an FMM and the overall size of the plurality of red sub pixels SR1 and SR2 and the overall size of the plurality of blue sub pixels SB1 and SB2 can be maximized.

Accordingly, the first red sub pixel SR1 and the second red sub pixel SR2 constituting the plurality of red sub pixels SR1 and SR2 are respectively disposed as being spaced at different distances from a boundary line between the reference pixel and the pixel adjacent to the reference pixel in the Y-axis direction. In detail, a distance $d_{12}$ between the first red sub pixel SR1 of the reference pixel and the first red pixel SR1 of the adjacent pixel may be smaller than a distance $d_{13}$ between the second red sub pixel SR2 of the reference pixel and the second red pixel SR2 of the adjacent pixel. Likewise, the first blue sub pixel SB1 and the second blue sub pixel SB2 constituting the plurality of blue sub pixels SB1 and SB2 are respectively disposed as being spaced at different distances from the boundary line between the reference pixel and the pixel adjacent to the reference pixel in the Y-axis direction. In detail, a distance $d_{15}$ between the first blue sub pixel SB1 of the reference pixel and the first blue sub pixel SB1 of the adjacent pixel may be smaller than a distance $d_{14}$ between the second blue sub pixel SB2 of the reference pixel and the second blue sub pixel SB2 of the adjacent pixel. Therefore, a distance between one of two second sub pixels and one of two third sub pixels may be different from a distance between the other one of the two second sub pixels and the other one of the two third sub pixels. Herein, the two second sub pixels may be the first red sub pixel SR1 and the second red sub pixel SR2 and the two third sub pixels may be the first blue sub pixel SB1 and the second blue sub pixel SB2.

Figure 12A:
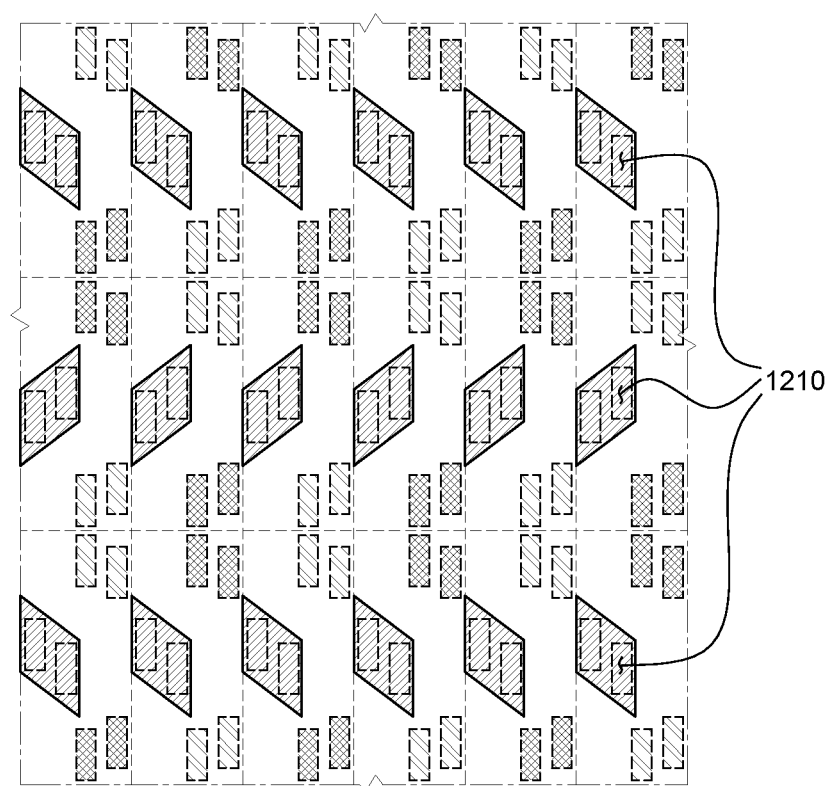
FIG. 12A through FIG. 12C are schematic plan views provided to explain a method of disposing sub pixels using an FMM in the organic light emitting display device according to another example embodiment of the present disclosure.
Figure 12B:
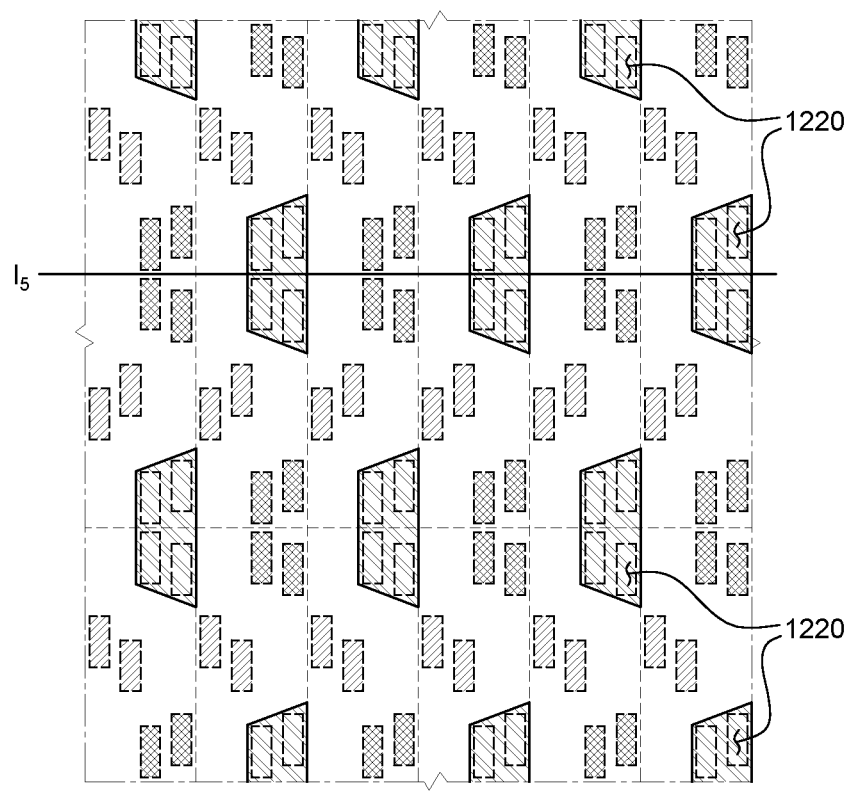
Figure 12C:
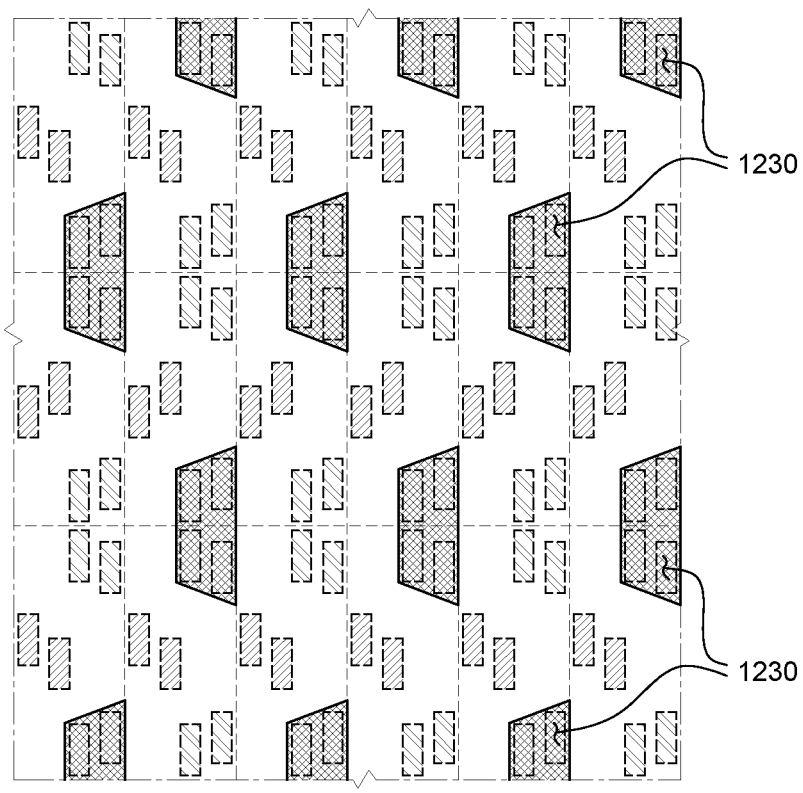
Figure 12C:
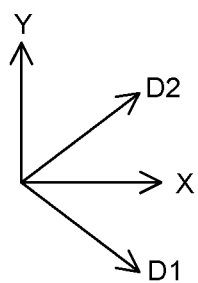

FIG. 12A through FIG. 12C are schematic plan views provided to explain a method of disposing sub pixels using an FMM in the organic light emitting display device according to another example embodiment of the present disclosure. FIG. 12A is a schematic plan view illustrating that a green sub pixel is deposited through an open area 1210 of a ninth FMM. FIG. 12B is a schematic plan view illustrating that a red sub pixel is deposited through an open area 1220 of a tenth FMM. FIG. 12C is a schematic plan view illustrating that a blue sub pixel is deposited through an open area 1230 of an eleventh FMM. The open areas 1220 and 1230 of the FMMs illustrated in FIG. 12B and FIG. 12C are different in shape from the open areas 720 and 730 of the FMMs illustrated in FIG. 7B and FIG. 7C, but the other components are substantially the same. Thus, redundant descriptions thereof will be omitted or will be briefly discussed below. FIG. 11 will be referred to for convenience in explanation.

Referring to FIG. 12A, a plurality of green sub pixels is formed through the open area 1210 of the ninth FMM. Herein, the open area 1210 of the ninth FMM may have a parallelogram shape or a diamond shape (or a rhombus shape). Thus, even if a green organic emission layer is wholly deposited on an anode and a bank layer disposed in the green sub pixel through the open area 1210 of the ninth FMM, an actual emission area is equivalent to that of the plurality of rectangular green sub pixels SG1 and SG2 as illustrated in FIG. 11. That is, the plurality of green sub pixels SG1 and SG2 adjacent to each other in one pixel has a rectangular shape and is arranged in the first diagonal direction D1 or the second diagonal direction D2.

Referring to FIG. 12B, a plurality of red sub pixels is formed through the open area 1220 of the tenth FMM. Herein, the open area 1220 of the tenth FMM may have a trapezoidal shape. Specifically, the open area 1220 of the tenth FMM may have a trapezoidal shape having two sides orthogonal to the fifth line $l_5$ as a boundary line of a pixel adjacent in the Y-axis direction and parallel to each other and two oblique sides. Particularly, the two oblique sides of the open area 1220 of the tenth FMM may be parallel to the first diagonal direction D1 and the second diagonal direction D2, respectively.

Referring to FIG. 12, a plurality of blue sub pixels is formed through the open area 1230 of the eleventh FMM. Herein, the open area 1230 of the eleventh FMM may also have a trapezoidal shape. That is, the open area 1230 of the eleventh FMM may have substantially the same shape as the open area 1220 of the tenth FMM.

In the organic light emitting display device according to another example embodiment of the present disclosure, the line connecting the centers of the plurality of red sub pixels SR1 and SR2 and the line connecting the centers of the plurality of blue sub pixels SB1 and SB2 are set as the third diagonal line $l_{d3}$ or the fourth diagonal line $l_{d4}$. Thus, each of the plurality of red sub pixels SR1 and SR2 and the plurality of blue sub pixels SB1 and SB2 may be disposed in the first diagonal direction D1 or the second diagonal direction D2.

Accordingly, it is possible to freely adjust an arrangement of each of the plurality of green sub pixels SG1 and SG2, the plurality of red sub pixels SR1 and SR2 and the plurality of blue sub pixels SB1 and SB2 so as to secure a distance between the plurality of green sub pixels SG1 and SG2, between the plurality of red sub pixels SR1 and SR2 and between the plurality of blue sub pixels SB1 and SB2. That is, the arrangement of each of the plurality of green sub pixels SG1 and SG2, the plurality of red sub pixels SR1 and SR2 and the plurality of blue sub pixels SB1 and SB2 may be adjusted so as to secure a maximum size of a sub pixel.

Further, a plurality of sub pixels can be disposed variously using an FMM including a trapezoidal open area.

According to the various methods of arrangement the plurality of green sub pixels SG1 and SG2, the plurality of red sub pixels SR1 and SR2 and the plurality of blue sub pixels SB1 and SB2, it may become easier to arrange sub pixels in a high-resolution organic light emitting display device.

Figure 13:
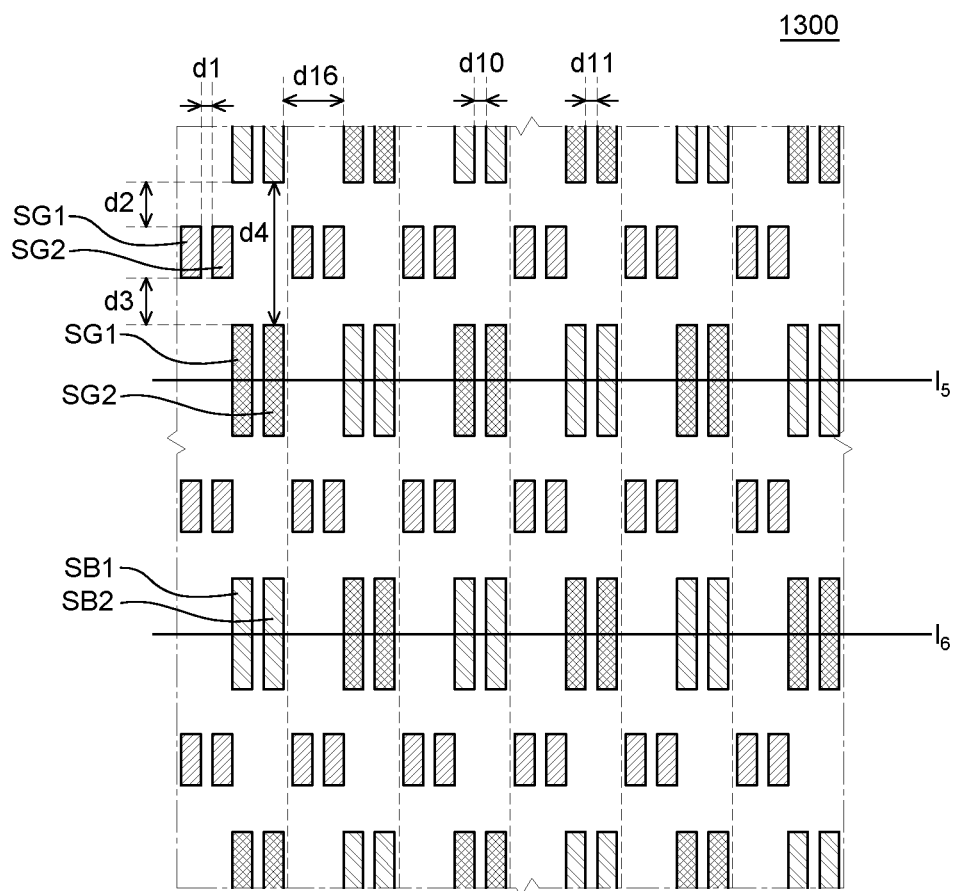
FIG. 13 is a schematic plan view provided to explain an organic light emitting display device according to another example embodiment of the present disclosure.

FIG. 13 is a schematic plan view provided to explain an organic light emitting display device according to another example embodiment of the present disclosure. An organic light emitting display device 1300 illustrated in FIG. 13 is different from the organic light emitting display device 1000 illustrated in FIG. 10 in configuration and arrangement of the red sub pixel SR and the blue sub pixel SB, and the other components are substantially the same. Thus, redundant descriptions thereof will be omitted or will be briefly discussed below.

Referring to FIG. 13, the plurality of red sub pixels SR1 and SR2 and the plurality of blue sub pixels SB1 and SB2 are disposed over a reference pixel and pixels adjacent to the reference pixel in the Y-axis direction. Further, each of the plurality of red sub pixels SR1 and SR2 and each of the plurality of blue sub pixels SB1 and SB2 are disposed to be symmetric to each other with reference to a boundary line between the reference pixel and the adjacent pixel. In detail, the plurality of red sub pixels SR1 and SR2 and the plurality of blue sub pixels SB1 and SB2 are respectively symmetric with respect to the fifth line $l_5$ and the sixth line $l_6$ as boundary lines between pixels adjacent to each other in the Y-axis direction. And, the plurality of red sub pixels SR1 and SR2 and the plurality of blue sub pixels SB1 and SB2 are disposed in the pixels adjacent to each other in the Y-axis direction at the same time. Thus, the plurality of red sub pixels SR1 and SR2 and the plurality of blue sub pixels SB1 and SB2 may have a very large size.

And, two second sub pixels and two third sub pixels may be disposed over a reference pixel and its adjacent pixel. And, each of the two second sub pixels and each of the two third sub pixels are symmetric to each other with respect to at least a boundary line between the reference pixel and the adjacent pixel. The second sub pixels may be the red sub pixels SR1 and SR2 or the blue sub pixels SB1 and SB2. The third sub pixels may be the red sub pixels SR1 and SR2 or the blue sub pixels SB1 and SB2.

A distance between sub pixels emitting the same color in one pixel may be remarkably smaller than a distance between sub pixels emitting different colors in adjacent pixels. In detail, a distance $d_1$ between the plurality of green sub pixels SG1 and SG2, a distance $d_{10}$ between the plurality of blue sub pixels SB1 and SB2, and a distance $d_{11}$ between the plurality of red sub pixels SR1 and SR2 are remarkably smaller than a distance $d_{16}$ between the plurality of blue sub pixels SB1 and SB2 and the plurality of red sub pixels SR1 and SR2.

In the organic light emitting display device 1300 according to another example embodiment of the present disclosure, even if a distance between the plurality of blue sub pixels SB1 and SB2 and the plurality of red sub pixels SR1 and SR2 is not reduced, since the plurality of blue sub pixels SB1 and SB2 and the plurality of red sub pixels SR1 and SR2 are disposed over pixels adjacent to each other, the sizes of the plurality of blue sub pixels SB1 and SB2 and the plurality of red sub pixels SR1 and SR2 is increased. That is, it is possible to increase the size of a sub pixel without further reducing a distance between sub pixels emitting different color lights by integrating sub pixels in adjacent pixels into one sub pixel.

The example embodiments of the present disclosure can also be described as follows:

According to another aspect of the present disclosure, an organic light emitting display device includes a plurality of pixels, each of the plurality of pixels including at least one red sub pixel, at least one green sub pixel, and at least one blue sub pixel. Red sub pixels and blue sub pixels of adjacent pixels are aligned in a first direction and are also aligned in a second direction, the second direction being a direction that intersects the first direction. Green pixels of adjacent pixels are aligned in the first direction and are also aligned in the second direction. The at least one green sub pixel of each pixel is disposed between the at least one red sub pixel and the at least one blue sub pixel of the each pixel, and the at least one green sub pixel is offset from the at least one red sub pixel and the at least one blue sub pixel in the first direction and the second direction in the each pixel.

According to one or more embodiments of the present disclosure, the at least one red sub pixel and the at least one blue sub pixel of the each pixel may be aligned in the first direction.

According to one or more embodiments of the present disclosure, the red sub pixels and the blue sub pixels of the adjacent pixels may be alternately arranged in the first direction.

According to one or more embodiments of the present disclosure, the red sub pixels of the adjacent pixels arranged in the second direction may be immediately adjacent to each other, and the blue sub pixels of the adjacent pixels arranged in the second direction may be immediately adjacent to each other.

According to one or more embodiments of the present disclosure, a size of each green sub pixel may be smaller than a size of each red sub pixel and each blue sub pixel in each pixel.

According to one or more embodiments of the present disclosure, each green sub pixel may include at least a first part and a second part, and the first part may be offset from the red sub pixels and the blue sub pixels in the first direction while the second part may be aligned with the red sub pixels and the blue sub pixels in the first direction.

According to one or more embodiments of the present disclosure, each blue sub pixel in one pixel may include at least a first part and a second part, and the first part may be offset from the second part in the first direction in the one pixel.

According to one or more embodiments of the present disclosure, each red sub pixel in one pixel may include at least a first part and a second part, and the first part may be offset from the second part in the first direction in the one pixel.

According to another aspect of the present disclosure, an organic light emitting display device includes a plurality of pixels, each of the plurality of pixels including a plurality of sub pixels having one of a plurality of colors, and a first distance between the plurality of sub pixels of different colors is greater than a second distance between the plurality of sub pixels of the same color.

According to one or more embodiments of the present disclosure, the plurality of colors may include red, green and blue.

According to one or more embodiments of the present disclosure, the first distance and the second distance may be located in among the plurality of pixels.

According to one or more embodiments of the present disclosure, sub pixels of green color may have the second distance.

According to one or more embodiments of the present disclosure, the sub pixels of the green color having the second distance may be arranged end to end.

According to one or more embodiments of the present disclosure, the sub pixels of the green color having the second distance may be arranged side by side.

According to one or more embodiments of the present disclosure, the sub pixels of the green color having the second distance arranged side by side may be offset in a first direction.

According to one or more embodiments of the present disclosure, the first distance and the second distance may be located in among adjacent pixels being adjacent to the plurality of pixels.

According to one or more embodiments of the present disclosure, the sub pixels of at least one of blue color and red color may have the first distance.

According to one or more embodiments of the present disclosure, the sub pixels of the at least one of the blue color and the red color having the first distance may be arranged end to end.

According to one or more embodiments of the present disclosure, the sub pixels of the at least one of the blue color and the red color having the first distance may be arranged side by side.

According to one or more embodiments of the present disclosure, the sub pixels of the at least one of the blue color and the red color having the first distance arranged side by side may be offset in a first direction.

According to an aspect of the present disclosure, an organic light emitting display device comprises a plurality of pixels. Each of the plurality of pixels has a plurality of first sub pixels, at least one second sub pixel, and at least one third sub pixel. The plurality of first sub pixels are disposed on a first line extended in a first direction, the at least one second sub pixel is disposed on one side of the first line, and the at least one third sub pixel is disposed on the other side of the first line. The at least one second sub pixel and the at least one third sub pixel are disposed on a second line extended in a second direction different from the first direction. A reference pixel among the plurality of pixels and an adjacent pixel adjacent to the reference pixel in the second direction are symmetric with respect to a boundary line between the reference pixel and the adjacent pixel. In the organic light emitting display device according to an aspect of the present disclosure, sub pixels emitting the same color are arranged adjacent to each other. Thus, it is possible to secure a margin sufficient to arrange sub pixels emitting different colors and also possible to increase the size of each sub pixel.

According to one or more embodiments of the present disclosure, the first sub pixels may include a green sub pixel.

According to one or more embodiments of the present disclosure, a size of the first sub pixels may be smaller than a size of the second sub pixel and a size of the third sub pixel.

According to one or more embodiments of the present disclosure, each of the plurality of pixels may include two first sub pixels, one second sub pixel, and one third sub pixel.

According to one or more embodiments of the present disclosure, a distance between sub pixels emitting different colors may be greater than a distance between sub pixels emitting the same color.

According to one or more embodiments of the present disclosure, the at least one second sub pixel and the at least one third sub pixel are alternately disposed on a third line parallel to the first line.

According to one or more embodiments of the present disclosure, the plurality of first sub pixels may have polygonal shapes.

According to one or more embodiments of the present disclosure, the plurality of first sub pixels may have rectangular shapes of which long sides are parallel to the first line.

According to one or more embodiments of the present disclosure, the plurality of first sub pixels may have rectangular shapes of which long sides are parallel to the second line.

According to one or more embodiments of the present disclosure, a first diagonal line connecting centers of each of the plurality of first sub pixels in the reference pixel may be extended in a direction diagonal to the first line, and a second diagonal line connecting the centers of each of the plurality of first sub pixels in the adjacent pixel may be symmetric to the first diagonal line with respect to the boundary line.

According to one or more embodiments of the present disclosure, the at least one second sub pixel and the at least one third sub pixel may have rectangular shapes extended in different directions.

According to one or more embodiments of the present disclosure, the plurality of first sub pixels may have triangular shapes, and the plurality of first sub pixels may be symmetric to each other in each of the plurality of pixels.

According to one or more embodiments of the present disclosure, the at least one second sub pixel may include two second sub pixels and the at least one third sub pixel may include two third sub pixels. The two second sub pixels may be symmetric to each other and the two third sub pixels may be symmetric to each other in each of the plurality of pixels.

According to one or more embodiments of the present disclosure, a distance between one of the two second sub pixels and one of the two third sub pixels may be different from a distance between the other one of the two second sub pixels and the other one of the two third sub pixels.

According to one or more embodiments of the present disclosure, the two second sub pixels and the two third sub pixels may be disposed over the reference pixel and the adjacent pixel, and each of the two second sub pixels and each of the two third sub pixels may be symmetrically disposed with respect to at least the boundary line.

According to another aspect of the present disclosure, an organic light emitting display device includes a plurality of pixels. Each of the plurality of pixels includes a plurality of first sub pixels commonly connected to a first data line, and a second sub pixel and a third sub pixel commonly connected to a second data line parallel to the first data line. A reference pixel among the plurality of pixels is symmetric to an adjacent pixel with respect to a boundary line between the reference pixel and the adjacent pixel adjacent to the reference pixel in an extension direction of the second data line. In the organic light emitting display device according to another aspect of the present disclosure, adjacent sub pixels emitting the same color are connected to the same data line. Thus, it is possible to supply the same current to the adjacent sub pixels emitting the same color and also possible to provide the same brightness.

According to one or more embodiments of the present disclosure, the plurality of first sub pixels in the reference pixel may be connected to different gate lines and may emit lights by different driving thin film transistors.

Although the example embodiments of the present disclosure have been described in detail with reference to the accompanying drawings, the present disclosure is not limited thereto and may be embodied in many different forms without departing from the technical concept of the present disclosure. Therefore, the example embodiments of the present disclosure are provided for illustrative purposes only but not intended to limit the technical concept of the present disclosure. The scope of the technical concept of the present disclosure is not limited thereto. Therefore, it should be understood that the above-described example embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. An organic light emitting display device, comprising:
a plurality of pixels, each of the plurality of pixels including a plurality of sub pixels having one of a plurality of colors,
wherein a first distance between the plurality of sub pixels of different colors is greater than a second distance between the plurality of sub pixels of the same color,
wherein the plurality of colors include red, green and blue, and
wherein sub pixels of green color are offset from sub pixels of red color and sub pixels of blue color both in a first direction and a second direction, the second direction being a direction that intersects the first direction.

2. The organic light emitting display device of claim 1, wherein the first distance and the second distance are located in among the plurality of pixels.

3. The organic light emitting display device of claim 2, wherein sub pixels of green color have the second distance, and
wherein the sub pixels of the green color having the second distance are arranged end to end.

4. The organic light emitting display device of claim 3, wherein the sub pixels of the green color having the second distance are arranged side by side and offset in a first direction.

5. The organic light emitting display device of claim 2, wherein the first distance and the second distance are located in among adjacent pixels being adjacent to the plurality of pixels.

6. The organic light emitting display device of claim 5, wherein the sub pixels of at least one of blue color and red color have the first distance, and are either arranged end to end or side by side.

7. The organic light emitting display device of claim 6, wherein the sub pixels of the at least one of the blue color and the red color having the first distance arranged side by side are offset in a first direction.

8. The organic light emitting display device of claim 2, wherein a size of sub pixels of the green color is smaller than a size of each of sub pixels of the red color and each of sub pixels of the blue color.

9. An organic light emitting display device, comprising:
a plurality of pixels, each of the plurality of pixels including at least one red sub pixel, at least one green sub pixel, and at least one blue sub pixel,
wherein a first distance between the plurality of sub pixels of different colors is greater than a second distance between the plurality of sub pixels of the same color, and
wherein the red sub pixels and the blue sub pixels of adjacent pixels are aligned in a first direction and are also aligned in a second direction, the second direction being a direction that intersects the first direction.

10. The organic light emitting display device of claim 9, wherein the at least one green sub pixel has a rectangular shape of which long sides are either parallel to the first direction or the second direction.

11. The organic light emitting display device of claim 9, wherein the red sub pixels and the blue sub pixels are disposed in a zigzag shape with respect to the first direction.

12. The organic light emitting display device of claim 9, wherein the red sub pixels and the blue sub pixels are commonly connected to the second direction.

13. The organic light emitting display device of claim 9, wherein a size of the green sub pixels is smaller than a size of each of the red sub pixels and each of the blue sub pixels.

14. The organic light emitting display device of claim 9, wherein the first distance between the blue sub pixel and the green sub pixel is greater than the second distance between the plurality of green sub pixels.

15. The organic light emitting display device of claim 9, wherein the first distance between the red sub pixel and the green sub pixel is greater than the second distance between the plurality of green sub pixels.

16. The organic light emitting display device of claim 9, wherein the first distance between the red sub pixel and the blue sub pixel is greater than the second distance between the plurality of green sub pixels.

17. The organic light emitting display device of claim 9, wherein the first distance between the blue sub pixel and the green sub pixel is greater than a third distance between the red sub pixels or the blue sub pixels being adjacent to each other in adjacent pixels.

18. The organic light emitting display device of claim 17, wherein the first distance between the blue sub pixel and the green sub pixel is equal to a fourth distance between the red sub pixel and the green sub pixel.

19. The organic light emitting display device of claim 9, wherein the first distance between the red sub pixel and the green sub pixel is greater than a third distance between the red sub pixels or the blue sub pixels being adjacent to each other in adjacent pixels.

20. The organic light emitting display device of claim 9, wherein the first distance between the red sub pixel and the blue sub pixel is greater than a third distance between the red sub pixels or the blue sub pixels being adjacent to each other in adjacent pixels.

* * * * *